US009349797B2

(12) United States Patent
Cheng et al.

(10) Patent No.: US 9,349,797 B2
(45) Date of Patent: May 24, 2016

(54) SIC DEVICES WITH HIGH BLOCKING VOLTAGE TERMINATED BY A NEGATIVE BEVEL

(75) Inventors: Lin Cheng, Chapel Hill, NC (US); Anant K. Agarwal, Chapel Hill, NC (US); Michael John O'Loughlin, Chapel Hill, NC (US); Albert Augustus Burk, Jr., Chapel Hill, NC (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 135 days.

(21) Appl. No.: 13/366,658

(22) Filed: Feb. 6, 2012

(65) Prior Publication Data

US 2013/0026493 A1    Jan. 31, 2013

Related U.S. Application Data

(63) Continuation-in-part of application No. 13/108,366, filed on May 16, 2011.

(51) Int. Cl.
*H01L 29/06* (2006.01)
*H01L 29/10* (2006.01)
(Continued)

(52) U.S. Cl.
CPC ........ *H01L 29/1016* (2013.01); *H01L 29/1004* (2013.01); *H01L 29/1095* (2013.01); *H01L 29/36* (2013.01); *H01L 29/732* (2013.01);
(Continued)

(58) Field of Classification Search
CPC .................. H01L 29/0661; H01L 29/1608
USPC .................... 257/496, 493, E29.012
See application file for complete search history.

(56) References Cited

U.S. PATENT DOCUMENTS 4,648,174 A    3/1987 Temple et al.
4,672,738 A    6/1987 Stengl et al.
(Continued)

FOREIGN PATENT DOCUMENTS

WO    9708754 A2    3/1997
WO    2007143008 A2    12/2007
WO    2011120979 A1    10/2011

OTHER PUBLICATIONS

Advisory Action for U.S. Appl. No. 13/108,365, mailed Jul. 11, 2013, 8 pages.
(Continued)

*Primary Examiner* — Amar Movva
(74) *Attorney, Agent, or Firm* — Anthony J. Josephson

(57) ABSTRACT

The present disclosure relates to a Silicon Carbide (SiC) semiconductor device having both a high blocking voltage and low on-resistance. In one embodiment, the semiconductor device has a blocking voltage of at least 10 kilovolts (kV) and an on-resistance of less than 10 milli-ohms centimeter squared (mΩ·cm$^2$) and even more preferably less than 5 mΩ·cm$^2$. In another embodiment, the semiconductor device has a blocking voltage of at least 15 kV and an on-resistance of less than 15 mΩ·cm$^2$ and even more preferably less than 7 mΩ·cm$^2$. In yet another embodiment, the semiconductor device has a blocking voltage of at least 20 kV and an on-resistance of less than 20 mΩ·cm$^2$ and even more preferably less than 10 mΩ·cm$^2$. The semiconductor device is preferably, but not necessarily, a thyristor such as a power thyristor, a Bipolar Junction Transistor (BJT), an Insulated Gate Bipolar Transistor (IGBT), or a PIN diode.

31 Claims, 18 Drawing Sheets

(51) Int. Cl.
*H01L 29/36* (2006.01)
*H01L 29/732* (2006.01)
*H01L 29/739* (2006.01)
*H01L 29/74* (2006.01)
*H01L 29/745* (2006.01)
*H01L 29/78* (2006.01)
*H01L 29/861* (2006.01)
*H01L 29/16* (2006.01)

(52) U.S. Cl.
CPC ............ *H01L29/7397* (2013.01); *H01L 29/74* (2013.01); *H01L 29/745* (2013.01); *H01L 29/7813* (2013.01); *H01L 29/861* (2013.01); *H01L 29/0615* (2013.01); *H01L 29/1608* (2013.01)

(56) References Cited

U.S. PATENT DOCUMENTS

| | | | |
|---|---|---|---|
| 5,552,625 | A | 9/1996 | Murakami et al. |
| 5,914,500 | A | 6/1999 | Bakowski et al. |
| 5,967,795 | A | 10/1999 | Bakowsky et al. |
| 5,970,324 | A | 10/1999 | Driscoll |
| 5,977,605 | A * | 11/1999 | Bakowsky et al. ............ 257/496 |
| 6,469,359 | B2 | 10/2002 | Bakowski et al. |
| 7,345,310 | B2 | 3/2008 | Agarwal et al. |
| 7,372,087 | B2 * | 5/2008 | Chen et al. .................... 257/263 |
| 7,498,651 | B2 | 3/2009 | Van Zeghbroeck |
| 7,759,186 | B2 | 7/2010 | Imhoff et al. |
| 7,838,377 | B2 | 11/2010 | Zhang et al. |
| 8,363,586 | B2 | 1/2013 | Rosario et al. |
| 2007/0080422 | A1 | 4/2007 | Falck et al. |
| 2007/0145378 | A1 | 6/2007 | Agarwal et al. |
| 2010/0055882 | A1 | 3/2010 | Imhoff et al. |
| 2012/0218796 | A1 | 8/2012 | Okamoto |
| 2012/0292636 | A1 | 11/2012 | Zhang et al. |
| 2013/0020611 | A1 | 1/2013 | Gumaelius |
| 2015/0021742 | A1 | 1/2015 | Van Brunt et al. |

OTHER PUBLICATIONS

Ghandi, R. et al., "High-Voltage 4H—SiC PiN Diodes With Etched Junction Termination Extension," IEEE Electron Device Letters, vol. 30, No. 11, Nov. 2009, pp. 1170-1172.
Li, X. et al., "Multistep junction termination extension for SiC power devices," Electronics Letters, vol. 37, No. 6, Mar. 15, 2001, pp. 392-393.
Baliga, B. J., "Fundamentals of Power Semiconductor Devices", Springer Science, 2008, p. 653; 208; 211.
Zhang, Q. J. et al., "12 kV, 1 cm2 SiC GTO Thyristors with Negative Bevel Termination," presented at ICSCRM 2011, Cleveland, Ohio, USA, Sep. 11-16, 2011, 4 pages.
Zhang, Q. J. et al., "SiC Super Thyristor Technology Development: Present Status and Future Perspective," 2011 Pulsed Power Conference, Jun. 19-23, 2011, 6 pages.
International Search Report and Written Opinion for PCT/US2012/037215 mailed Sep. 25, 2012, 19 pages.
Agarwal, A. et al., "Prospects of bipolar power devices in silicon carbide," 34th Annual Conference of Industrial Electronics, Nov. 10, 2008, pp. 2879-2884.
Matsuura, H. et al., "Mechanisms of reduction in hole concentration in Al-doped 4H—SiC by 200 keV electron irradiation," JAEA Review, Japan Atomic Energy Agency, vol. 2009-041, Dec. 1, 2009, pp. 14.
Non-final Office Action for U.S. Appl. No. 13/108,366 mailed Oct. 17, 2012, 7 pages.
Yu, H. et al., "An IGBT and MOSFET gated SiC bipolar junction transistor," Conference Record of the 2002 IEEE Industry Applications Conference, vol. 4, Oct. 13-18, 2002, pp. 2609-2613.
Invitation to Pay Additional Fees and, Where Applicable, Protest Fee for PCT/US2012/037215 mailed Jul. 20, 2012, 8 pages.
International Search Report and Written Opinion for PCT/US2013/024740, mailed Jun. 14, 2013, 12 pages.
Hiyoshi, T. et al., "Bevel Mesa Combined with Implanted Junction Termination Structure for 10 kV SiC PiN Diodes," Materials Science Forum, vols. 600-603, 2009, pp. 995-998.
Kimoto, Tsunenobu et al., "Enhancement of Carrier Lifetimes in n-Type 4H—SiC Epitaxial Layers by Improved Surface Passivation," Applied Physics Express, vol. 3, Dec. 10, 2010, 3 pages.
Final Office Action for U.S. Appl. No. 13/108,366, mailed Apr. 9, 2013, 9 pages.
Non-Final Office Action for U.S. Appl. No. 13/108,366, mailed Jan. 2, 2014, 9 pages.
International Preliminary Report on Patentability for PCT/US2012/037215, mailed Nov. 28, 2013, 11 pages.
Advisory Action for U.S. Appl. No. 13/108,366, mailed Jul. 25, 2014, 9 pages.
Final Office Action for U.S. Appl. No. 13/108,366, mailed Apr. 25, 2014, 11 pages.
International Preliminary Report on Patentability for PCT/US2013/024740, mailed Aug. 21, 2014, 8 pages.
Office Action of the Intellectual Property Office for Taiwanese Patent Application No. 101117452, issued Jan. 22, 2015, 16 pages.
Non-Final Office Action for U.S. Appl. No. 13/108,366, mailed Jan. 29, 2015, 14 pages.
Stengl, R. et al., "Variation of Lateral Doping—A New Concept to Avoid High Voltage Breakdown of Planar Junctions," 1985 International Electron Devices Meeting, vol. 31, 1985, pp. 154-157.
International Search Report and Written Opinion for PCT/US2014/041680, mailed Sep. 9, 2014, 10 pages.
Final Office Action and Interview Summary for U.S. Appl. No. 13/108,366, mailed May 15, 2015, 7 pages.
Non-Final Office Action for U.S. Appl. No. 13/968,740, mailed Apr. 20, 2015, 10 pages.
Notice of Allowance and Applicant-Initiated Interview Summary for U.S. Appl. No. 13/108,366, mailed Aug. 4, 2015, 12 pages.
Final Office Action for U.S. Appl. No. 13/968,740, mailed Aug. 4, 2015, 14 pages.
Notice of Allowance for U.S. Appl. No. 13/108,366, mailed Nov. 25, 2015, 10 pages.
Advisory Action for U.S. Appl. No. 13/968,740, mailed Nov. 20, 2015, 3 pages.
Examination Report for European Patent Application No. 12724225.3, mailed Dec. 4, 2015, 5 pages.
European Patent Office Communication for European Patent Application No. 12724225.3, mailed Dec. 10, 2015, 4 pages.
International Preliminary Report on Patentability for International Patent Application No. PCT/US2014/041680, mailed Feb. 25, 2016, 8 pages.

* cited by examiner

SIC DEVICES WITH HIGH BLOCKING VOLTAGE TERMINATED BY A NEGATIVE BEVEL

RELATED APPLICATIONS

This application is a continuation-in-part of U.S. patent application Ser. No. 13/108,366, filed May 16, 2011, the disclosure of which is hereby incorporated herein by reference in its entirety.

GOVERNMENT SUPPORT

This invention was made with government funds under contract number DAAD19-01-C-0067 Task Order 4 awarded by the U.S. Army. The U.S. Government may have rights in this invention.

FIELD OF THE DISCLOSURE

The present disclosure relates to semiconductor devices fabricated in Silicon Carbide (SiC).

BACKGROUND

Silicon Carbide (SiC) is a desirable material for high-power and high-temperature semiconductor devices due to its high breakdown field, high thermal conductivity, and wide bandgap. However, to take advantage of the high breakdown field in a high-voltage device, an efficient edge termination is needed. More specifically, field crowding at the edge of the device results in device breakdown at the edge of the device, which in turn decreases the blocking voltage of the device well below the ideal blocking voltage (i.e., the blocking voltage of the ideal parallel-plane device). Thus, edge termination is an important issue in the design of SiC semiconductor devices and particularly for high-power SiC semiconductor devices.

One type of edge termination utilized for SiC semiconductor devices is a Junction Termination Extension (JTE). FIG. 1 illustrates an exemplary SiC semiconductor device, namely, a thyristor 10 that includes a number of JTE wells 12, 14, and 16. The thyristor 10 includes a substrate 18, an injection layer 20, a field stop layer 22, a drift layer 24, a base layer 26, and an anode layer 28. In order to form the JTE wells 12, 14, and 16, the base layer 26 is etched down to the drift layer 24 as illustrated. The JTE wells 12, 14, and 16 are then formed by ion implantation into an exposed surface of the drift layer 24. An anode contact 30 is formed on the anode layer 28, a cathode contact 32 is formed on a bottom surface of the substrate 18 opposite the injection layer 20, and gate contacts 34 and 36 are formed on corresponding gate regions 38 and 40 in the base layer 26. As a result of the etching of the base layer 26 down to the drift layer 24 to form the JTE wells 12, 14, and 16, a corner 42 is formed. The corner 42 causes electric field crowding, which in turn decreases the blocking voltage of the thyristor 10 to less than the ideal blocking voltage.

Thus, there is a need for an edge termination for a SiC semiconductor device that results in a blocking voltage that approaches the ideal blocking voltage for the ideal parallel-plane device.

SUMMARY

The present disclosure relates to a Silicon Carbide (SiC) semiconductor device having both a high blocking voltage and low on-resistance. In one embodiment, the semiconductor device has a blocking voltage of at least 10 kilovolts (kV) and an on-resistance of less than 10 milli-ohms centimeter squared (mΩ·cm$^2$) and even more preferably less than 5 mΩ·cm$^2$. In another embodiment, the semiconductor device has a blocking voltage of at least 15 kV and an on-resistance of less than 15 mΩ·cm$^2$ and even more preferably less than 7 mΩ·cm$^2$. In yet another embodiment, the semiconductor device has a blocking voltage of at least 20 kV and an on-resistance of less than 20 mΩ·cm$^2$ and even more preferably less than 10 mΩ·cm$^2$.

In one embodiment, a semiconductor device includes a negative bevel edge termination that includes multiple steps that approximate a smooth negative bevel edge termination at a desired slope. The negative bevel edge termination results in a high blocking voltage for the semiconductor device. More specifically, in one embodiment, the negative bevel edge termination includes at least five steps. In another embodiment, the negative bevel edge termination includes at least ten steps. In yet another embodiment, the negative bevel edge termination includes at least fifteen steps. The desired slope is, in one embodiment, less than or equal to 15 degrees. In one embodiment, the negative bevel edge termination results in a blocking voltage for the semiconductor device of at least 10 kV and an on-resistance of less than 10 mΩ·cm$^2$ and even more preferably less than 5 mΩ·cm$^2$. In another embodiment, the negative bevel edge termination results in a blocking voltage for the semiconductor device of at least 15 kV and an on-resistance of less than 15 mΩ·cm$^2$ and even more preferably less than 7 mΩ·cm$^2$. In yet another embodiment, the negative bevel edge termination results in a blocking voltage for the semiconductor device of at least 20 kV and an on-resistance of less than 20 mΩ·cm$^2$ and even more preferably less than 10 mΩ·cm$^2$.

The semiconductor device is preferably, but not necessarily, a thyristor such as a power thyristor, a Bipolar Junction Transistor (BJT), an Insulated Gate Bipolar Transistor (IGBT), or a PIN diode. Further, in one embodiment, the semiconductor device has a die area greater than or equal to one centimeter squared.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
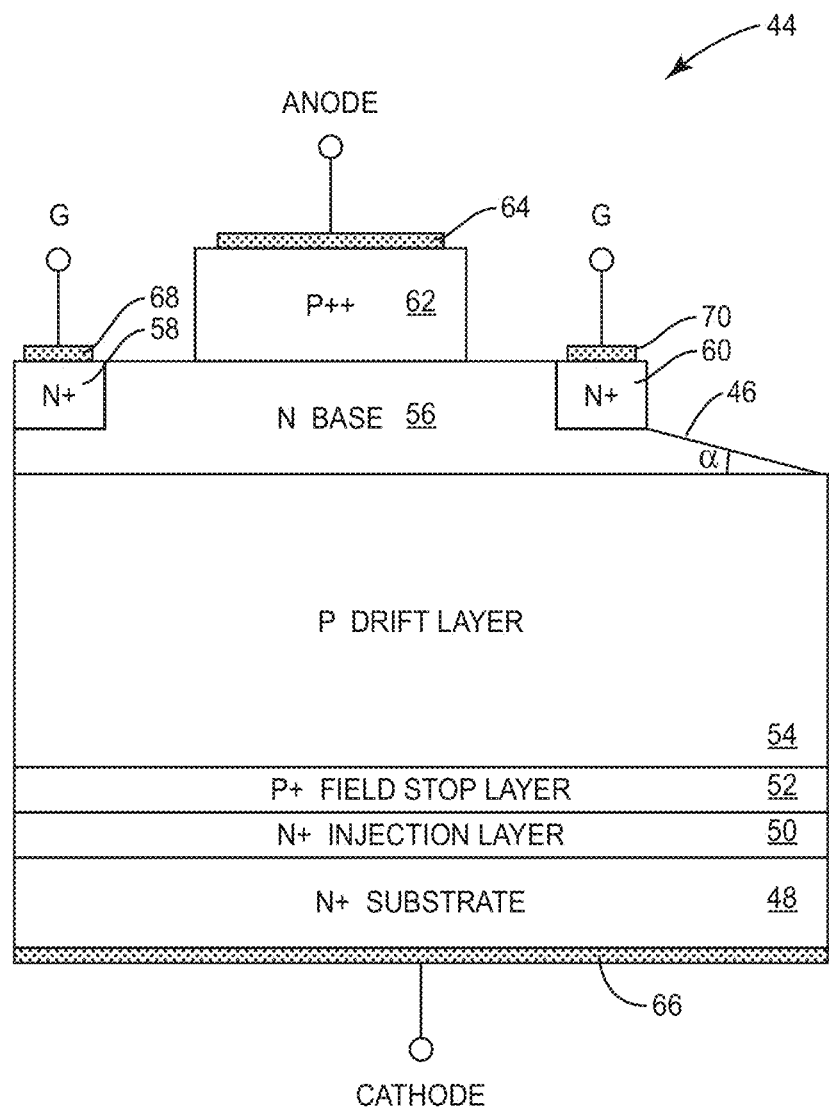
FIG. 2 illustrates a SiC thyristor including a negative bevel edge termination according to one embodiment of the present disclosure.
Figure 3:
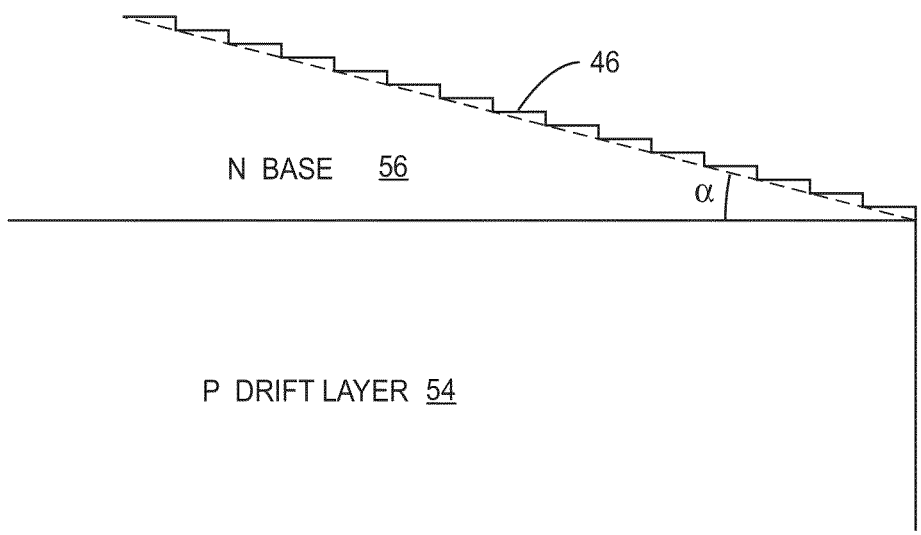
FIG. 3 illustrates the negative bevel edge termination of FIG. 2 in more detail where negative bevel edge termination is implemented as a multi-step negative bevel edge termination that includes a number of steps formed on a surface of a corresponding semiconductor layer according to one embodiment of the present disclosure.
Figure 4:
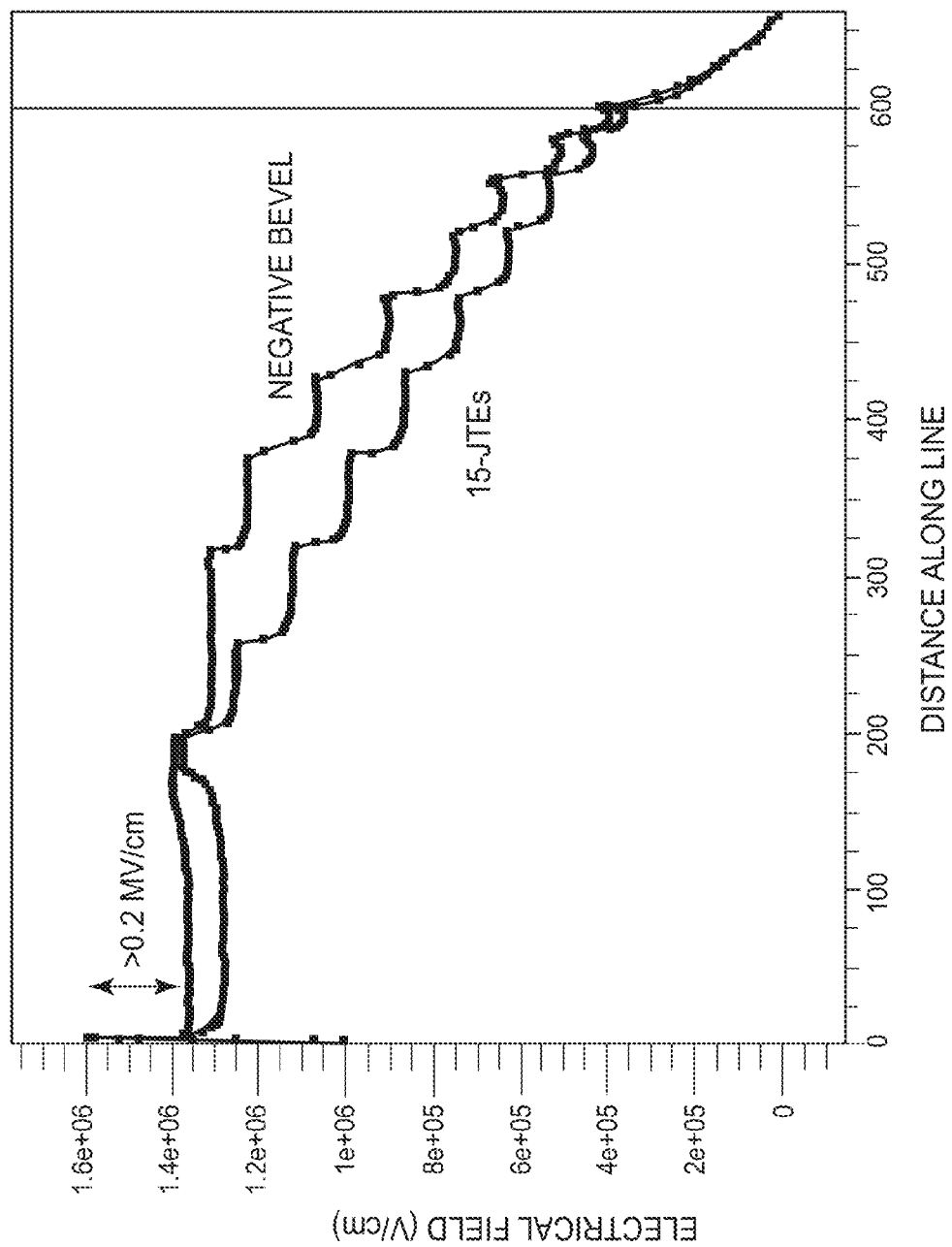
Figure 5:
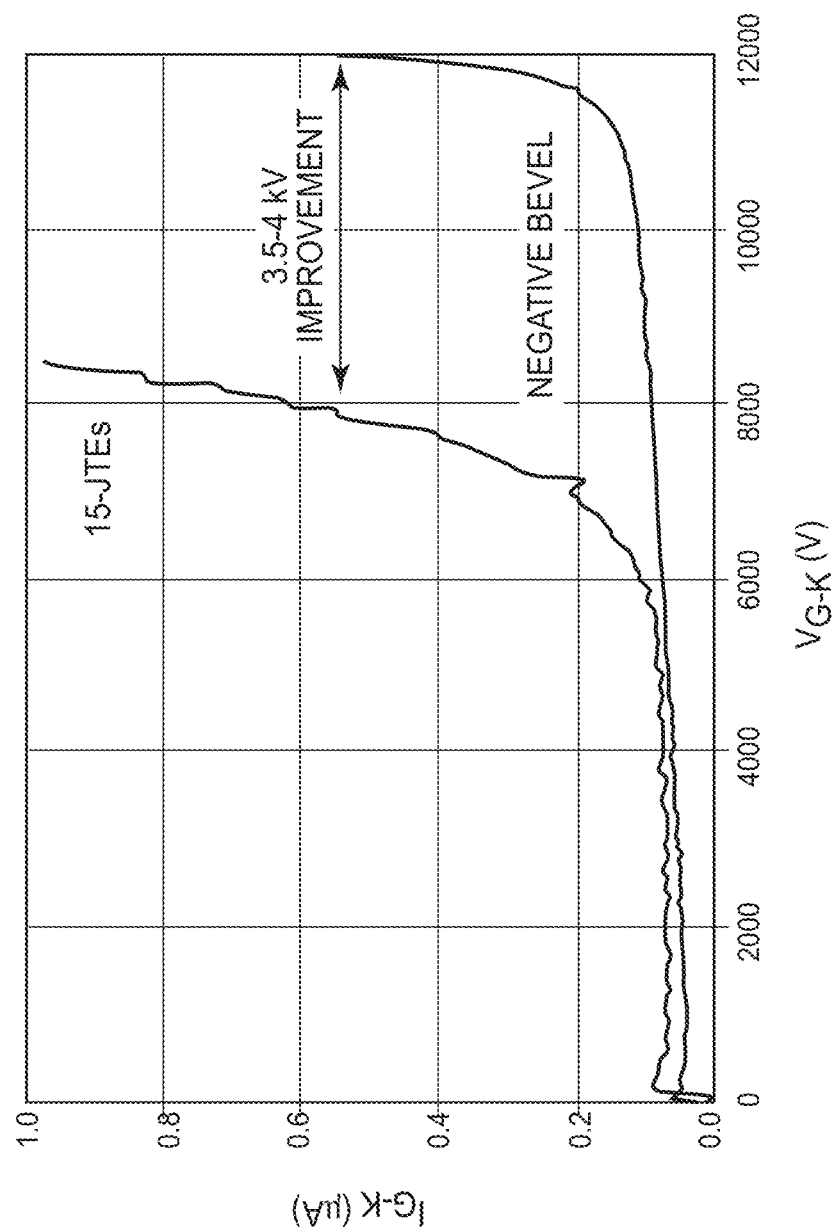
Figure 6:
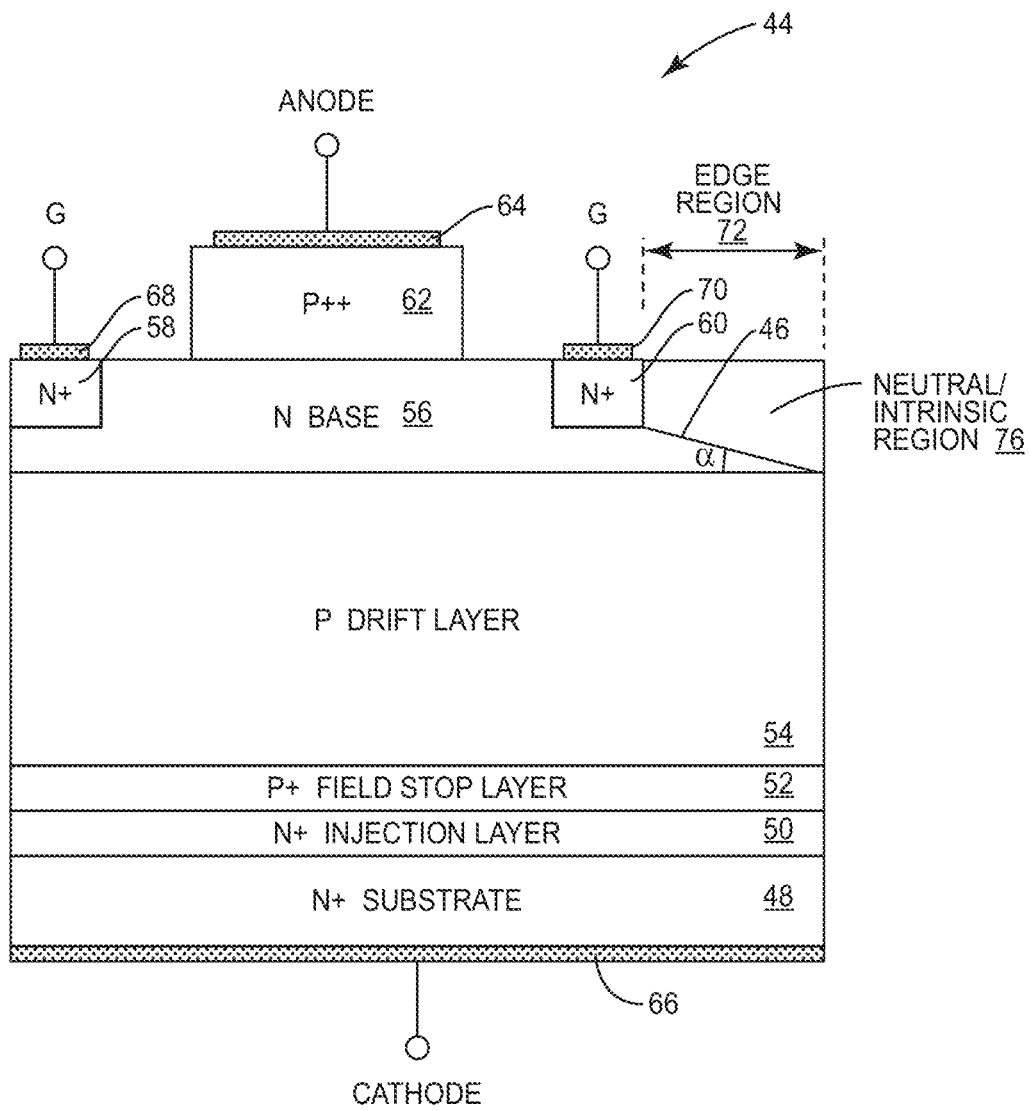
Figure 7:
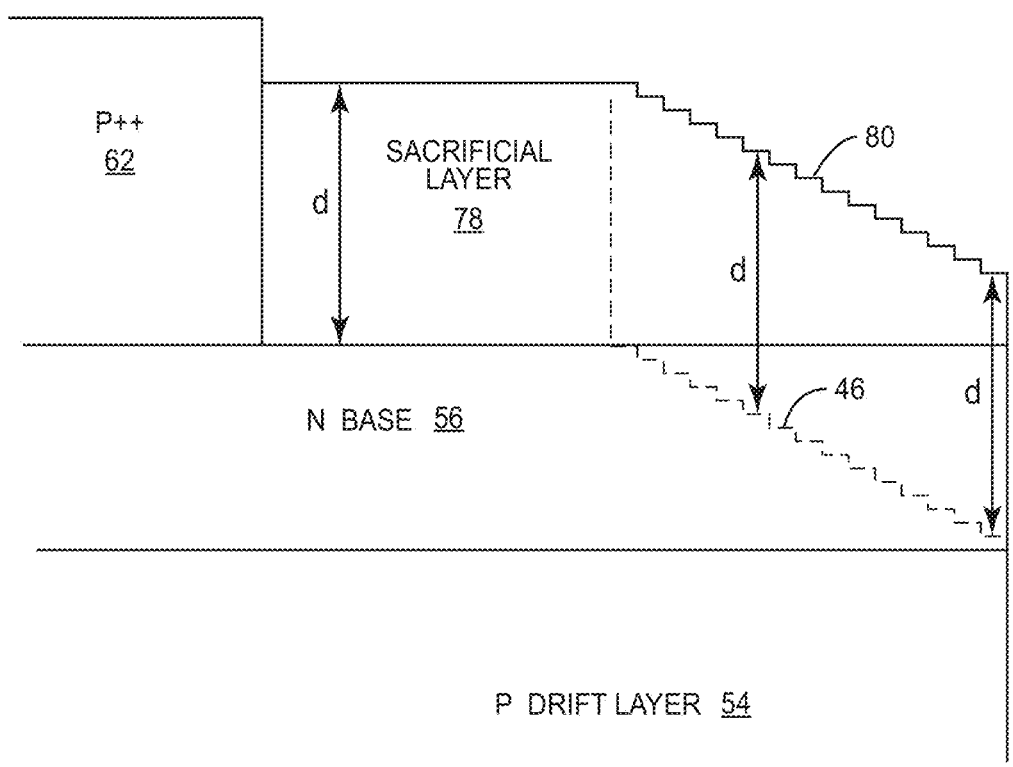
Figure 8:
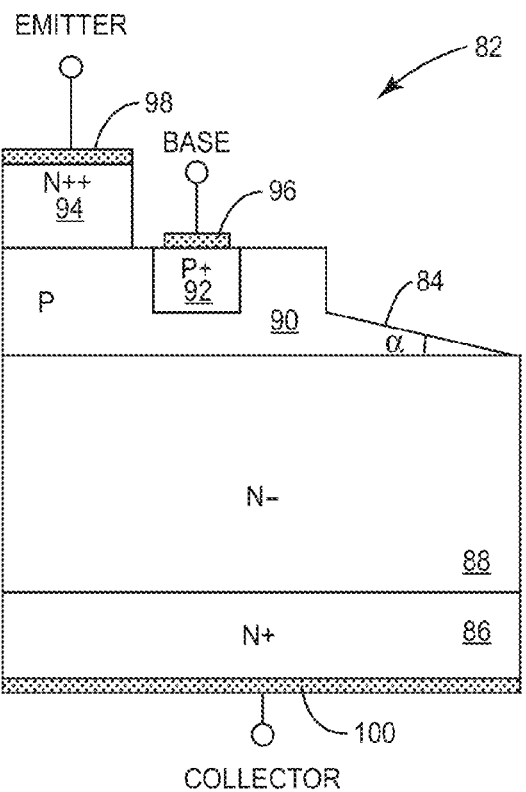
Figure 9:
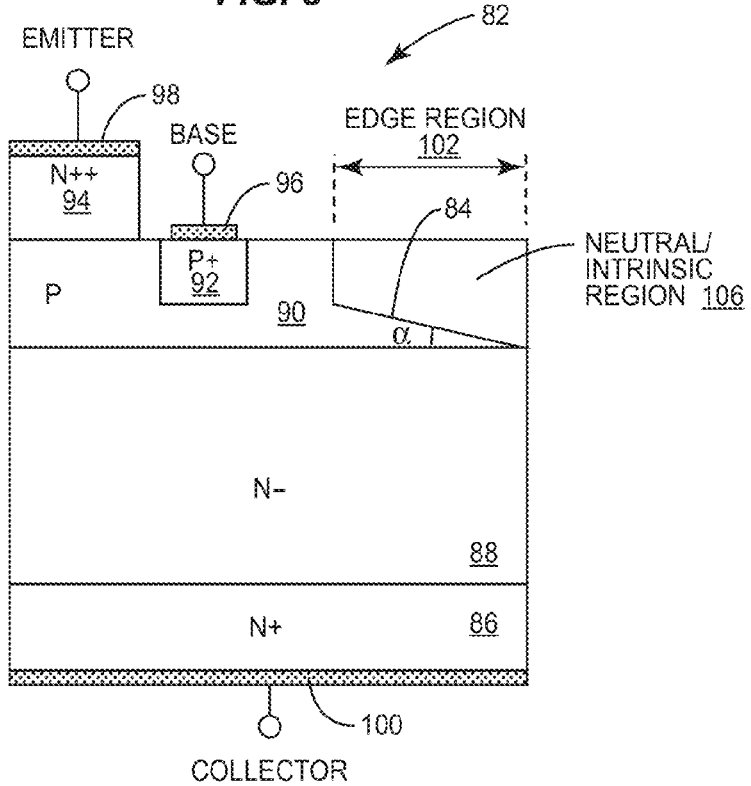
Figure 10:
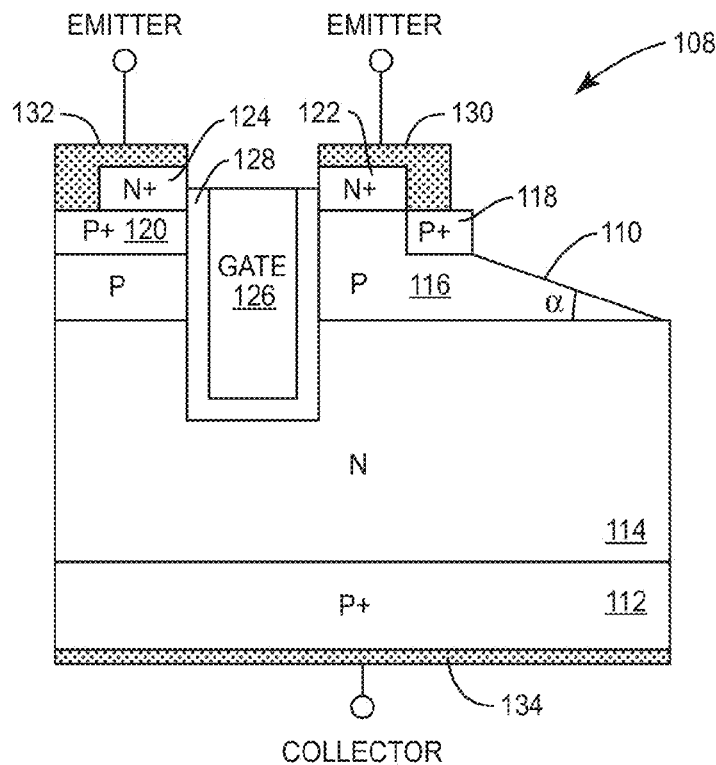
Figure 11:
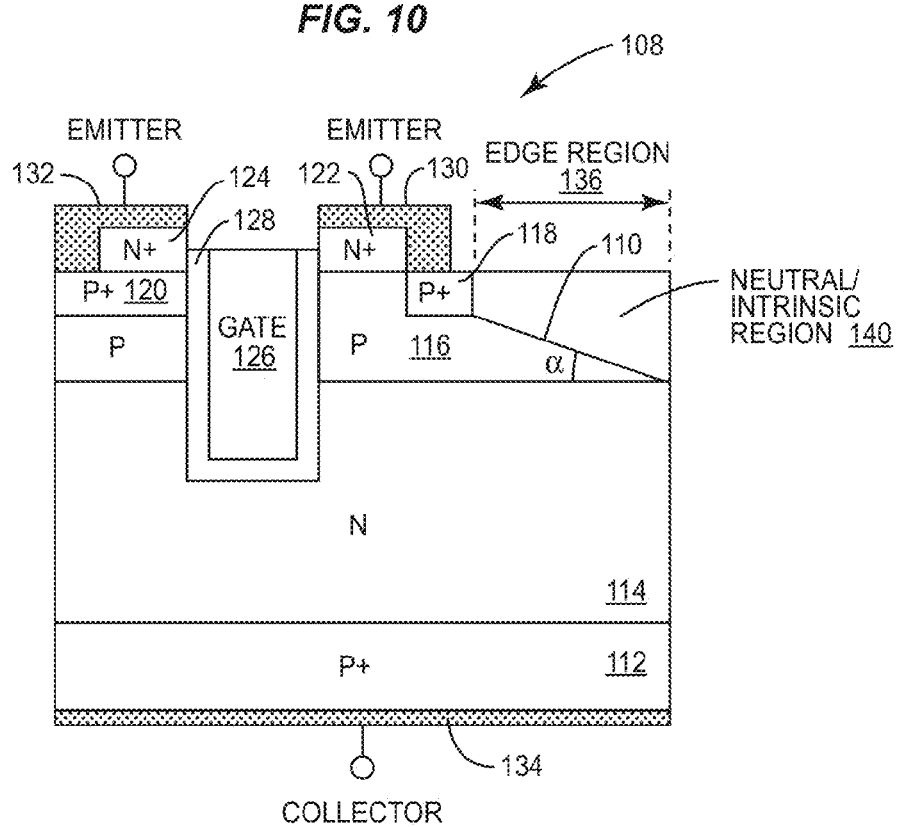
Figure 12:
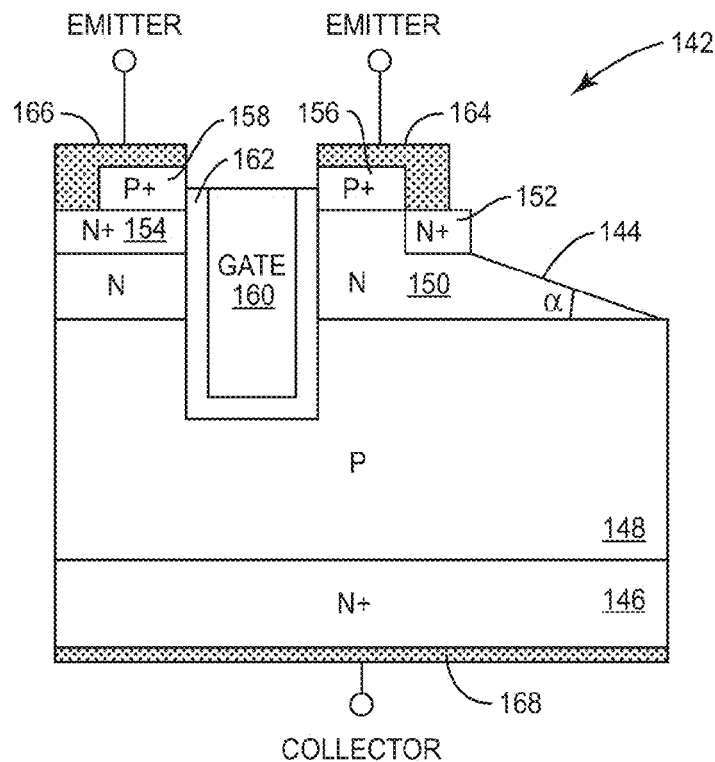
Figure 13:
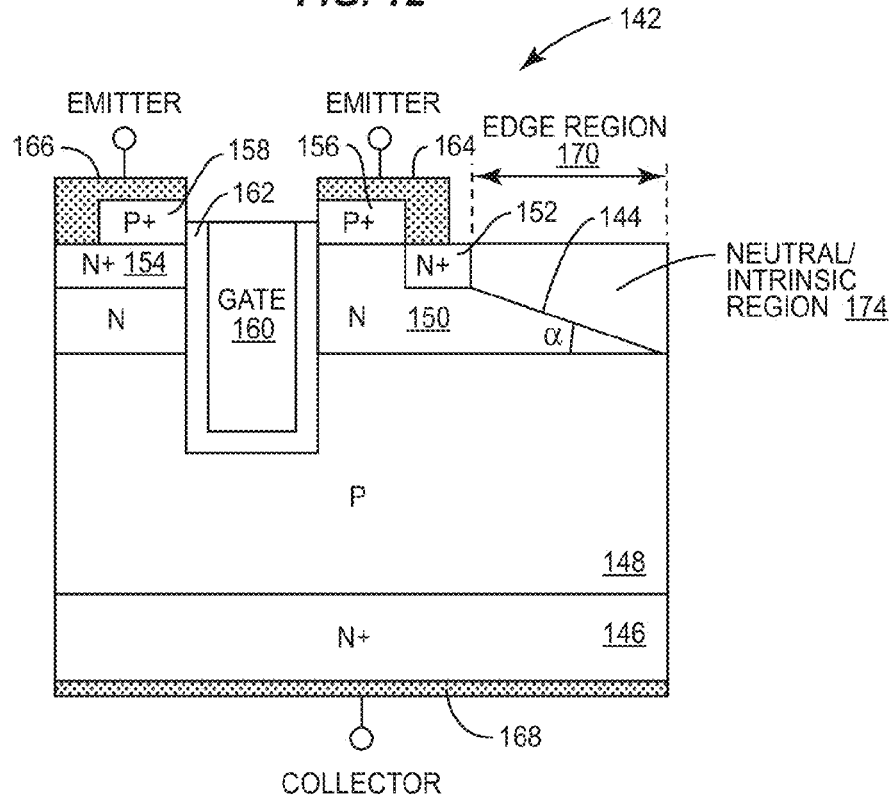
Figure 14:
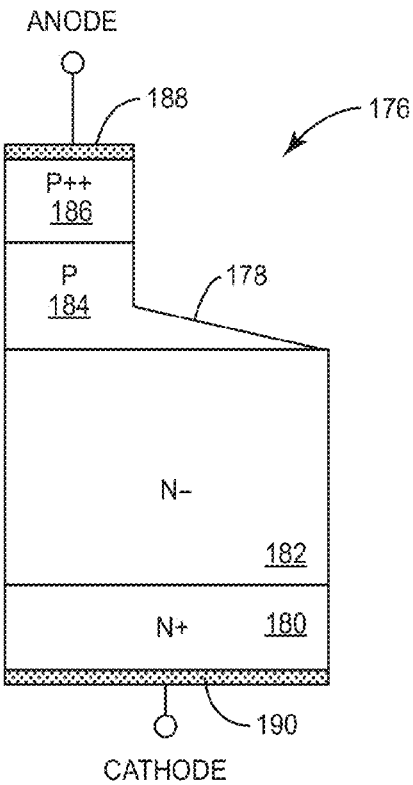
Figure 15:
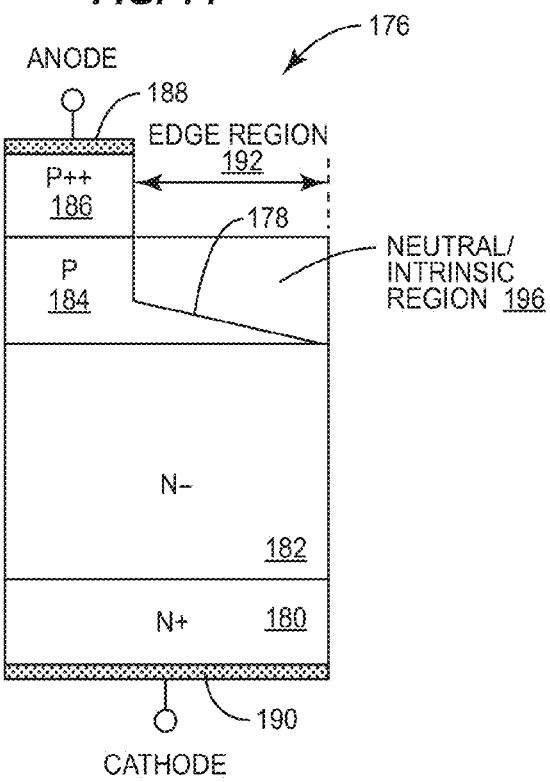
Figure 16:
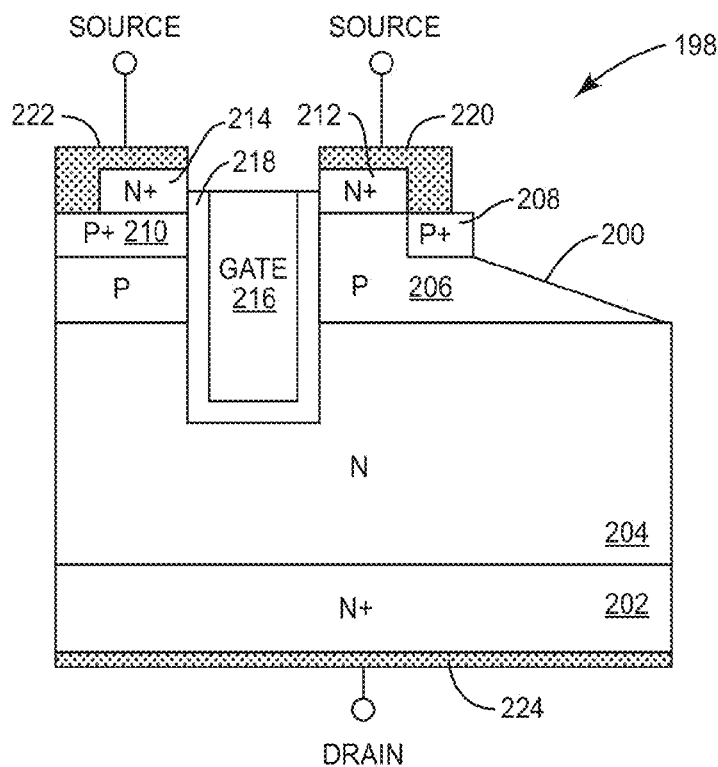
Figure 17:
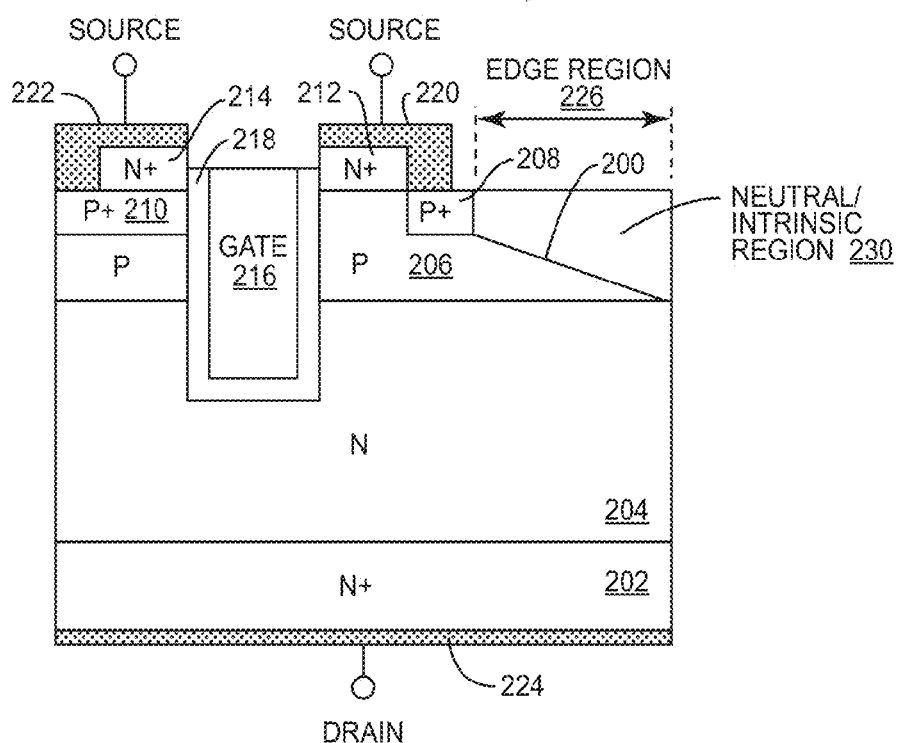
Figure 18:
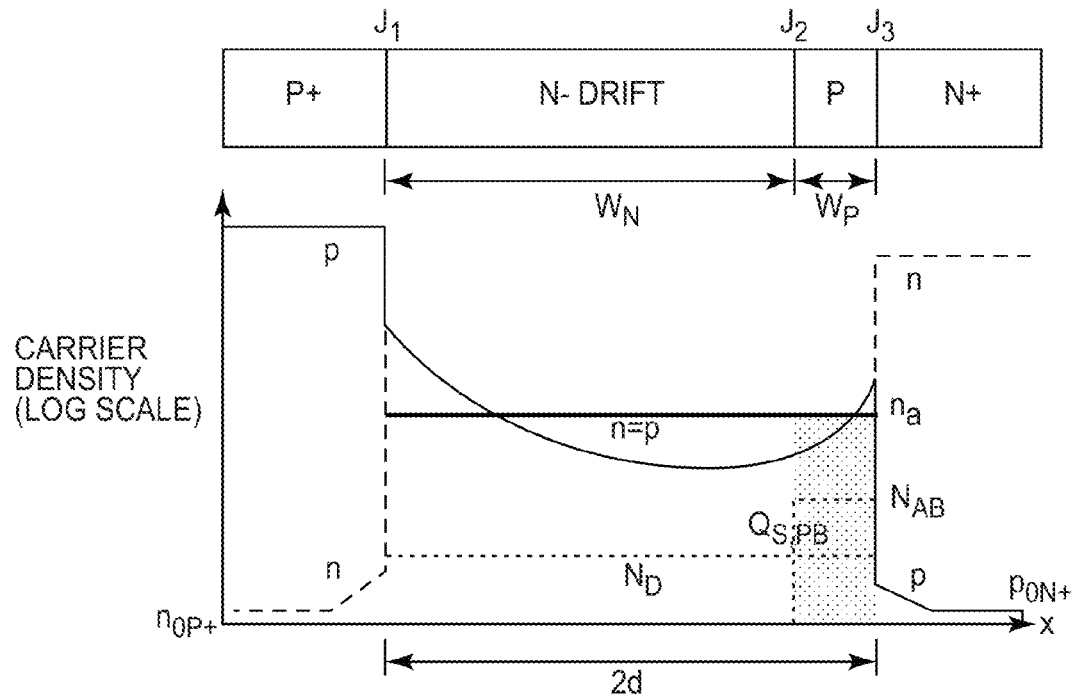
Figure 19:
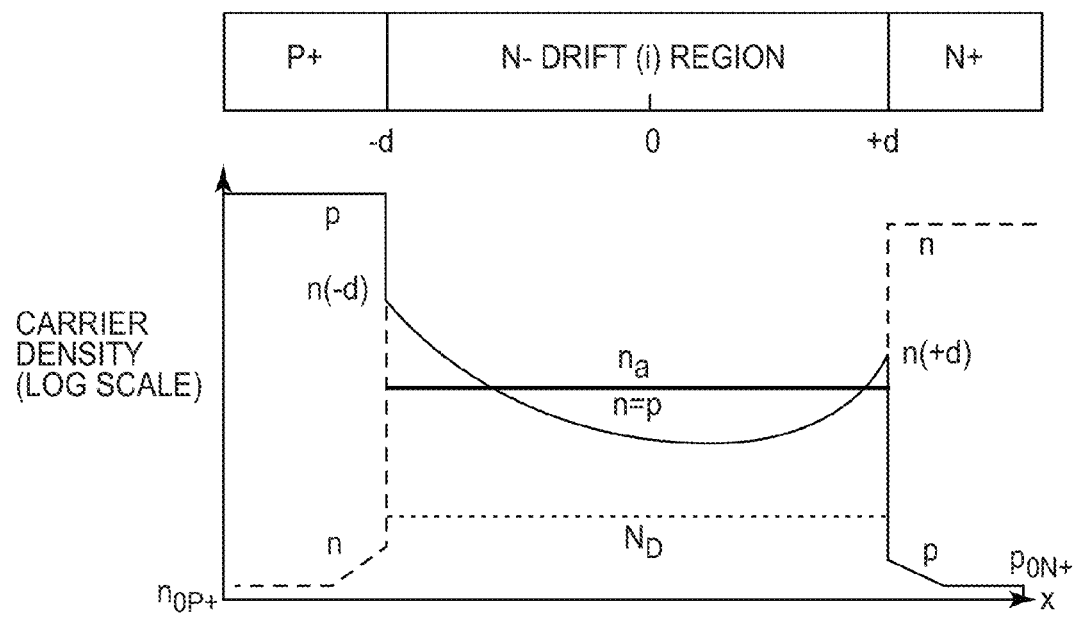
Figure 20:
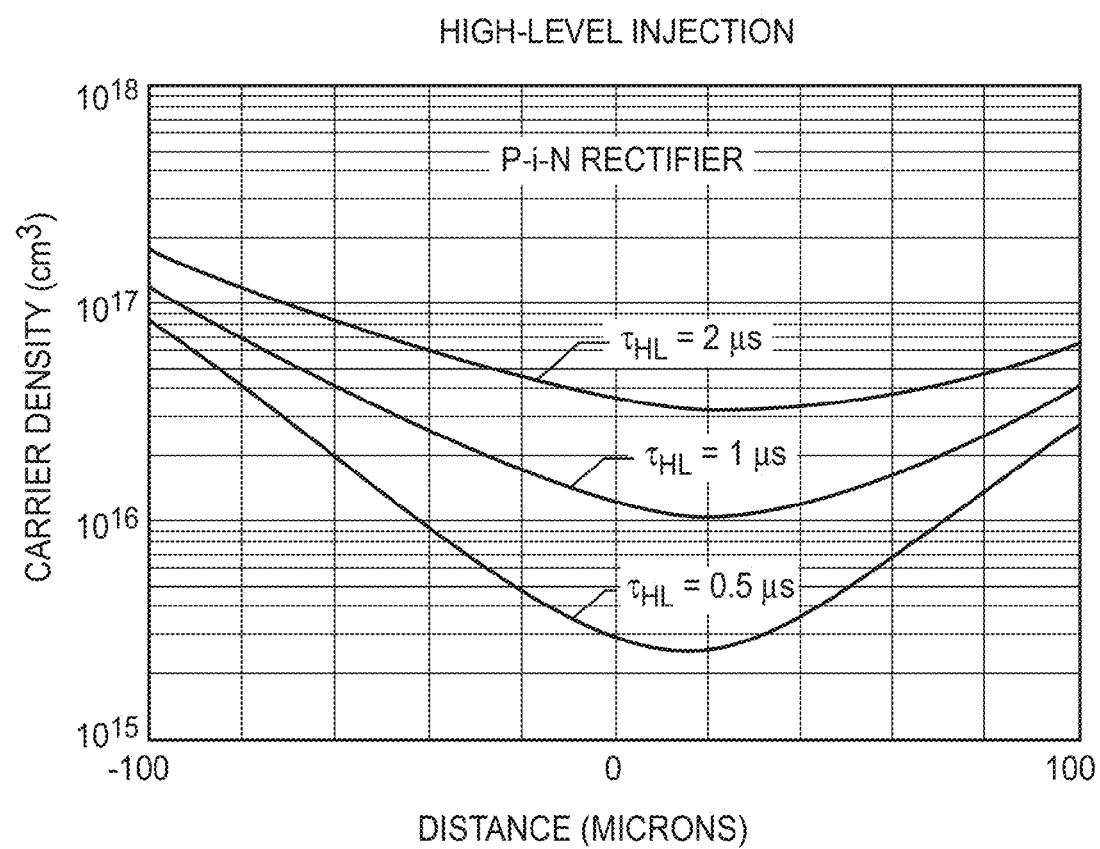
Figure 21A:
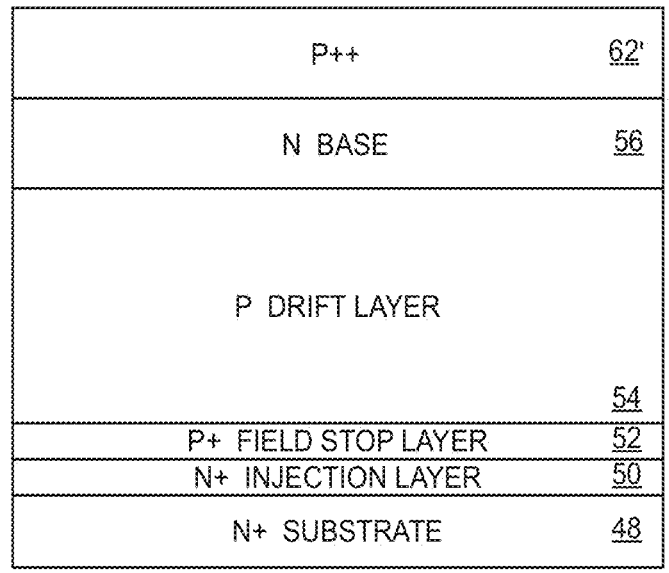
Figure 21B:
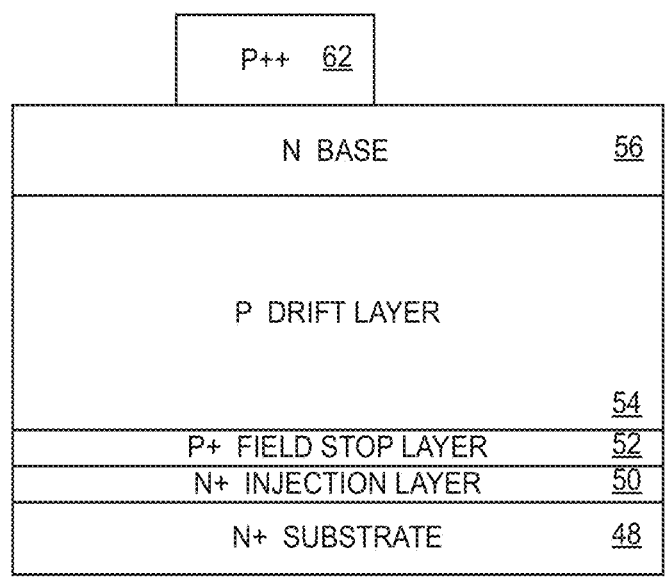
Figure 21C:
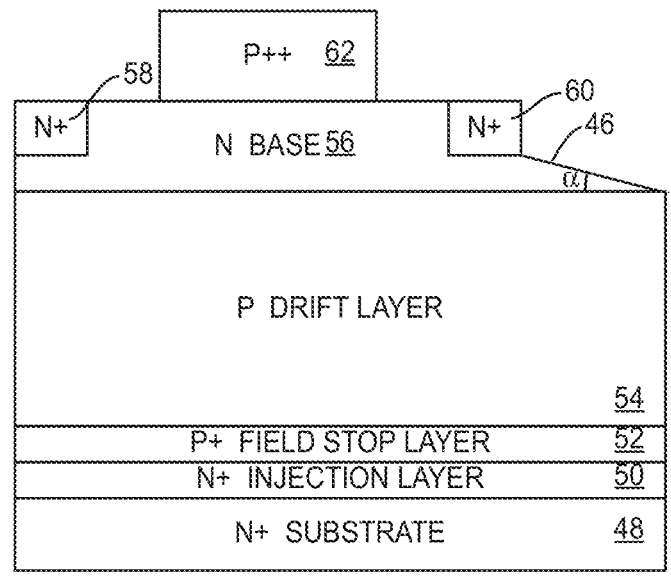
Figure 21D:
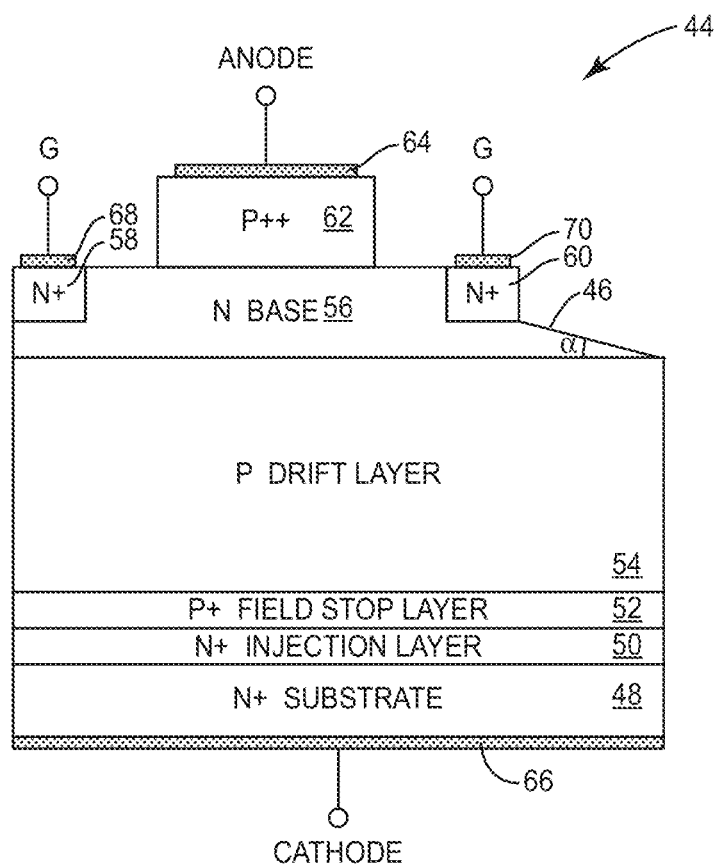
Figures 22A, 22B, 22C:
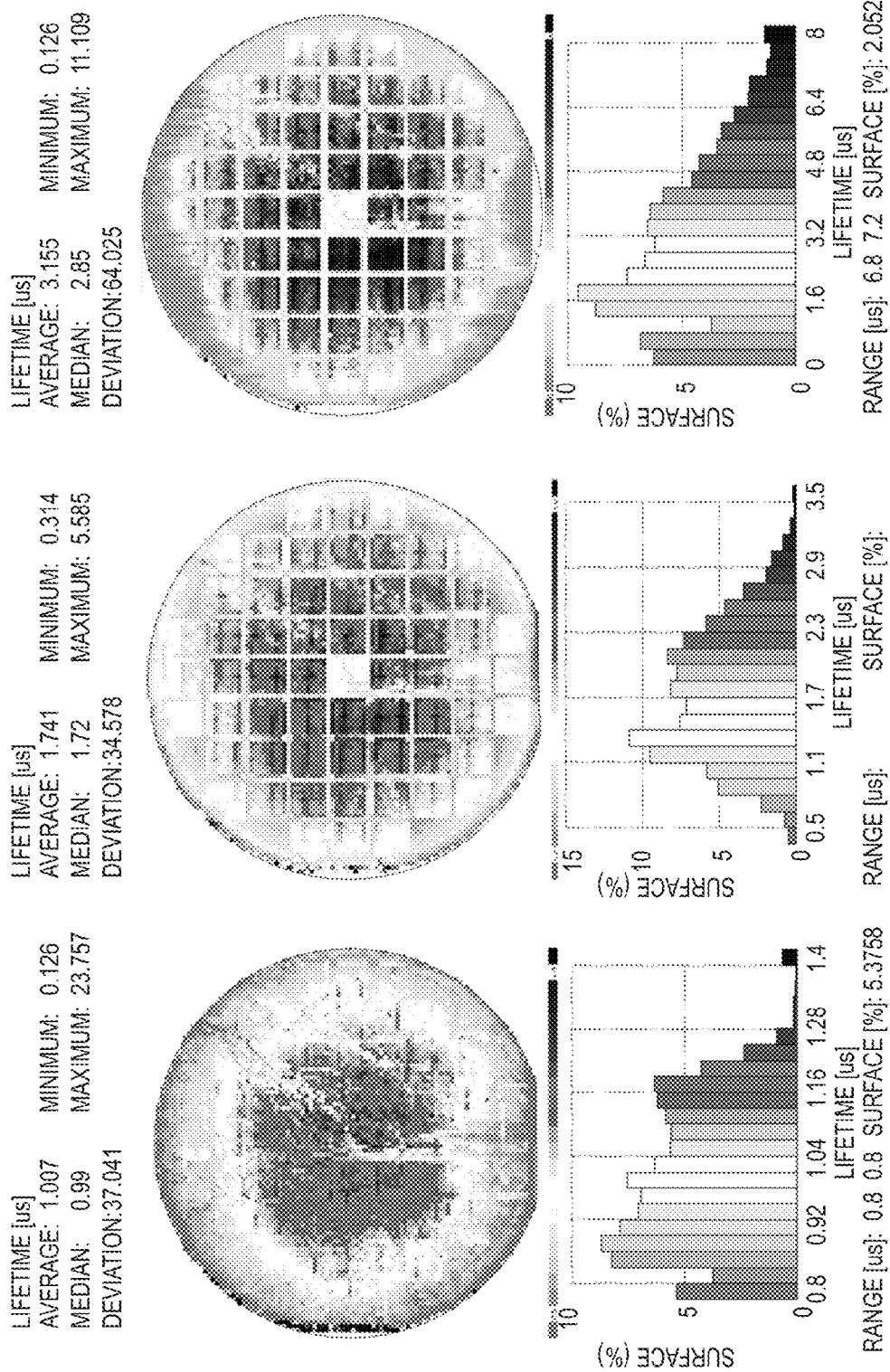
Figure 23:
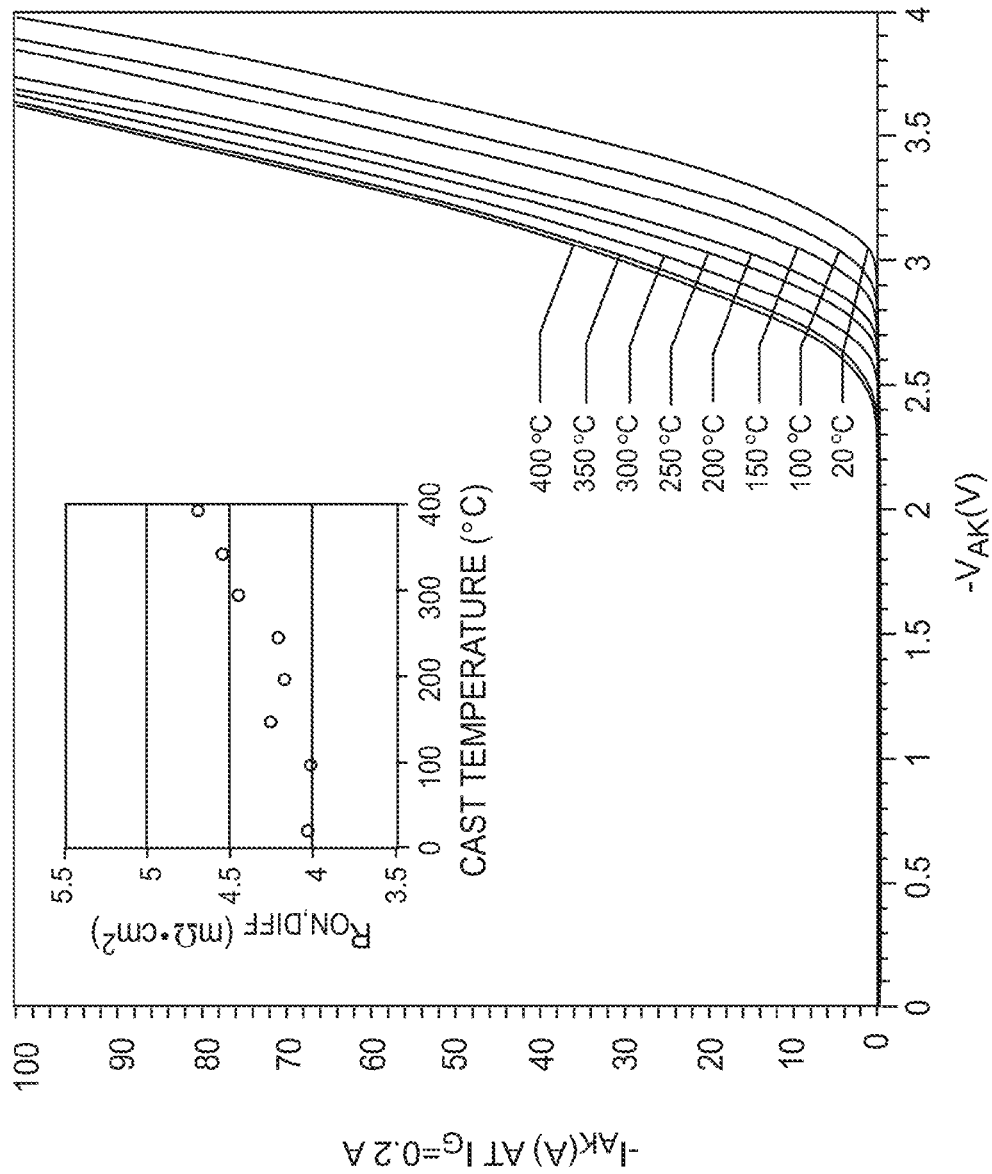

FIG. 4 graphically illustrates an electric field in the multi-step negative bevel edge termination of FIG. 3 as compared to that of a JTE termination according to one embodiment of the present disclosure;

FIG. 5 graphically illustrates a blocking voltage resulting from the multi-step negative bevel edge termination of FIG. 3 as compared to that of a JTE termination according to one embodiment of the present disclosure;

FIG. 6 illustrates a thyristor including a negative bevel edge termination formed by counter-doping the base layer according to another embodiment of the present disclosure;

FIG. 7 illustrates an embodiment where a multi-step negative bevel edge termination is provided by first forming a sacrificial layer on the base layer and then etching the sacrificial layer such that the desired multi-step characteristic is transferred to the base layer to thereby provide the multi-step negative bevel edge termination;

FIG. 8 illustrates a SiC Bipolar Junction Transistor (BJT) having a negative bevel edge termination like that illustrated in FIG. 3 according to one embodiment of the present disclosure;

FIG. 9 illustrates a SiC BJT having a negative bevel edge termination formed by counter-doping the base layer according to another embodiment of the present disclosure;

FIG. 10 illustrates a P-type SiC Insulated Gate Bipolar Transistor (IGBT) having a negative bevel edge termination like that illustrated in FIG. 3 according to one embodiment of the present disclosure;

FIG. 11 illustrates a P-type SiC IGBT having a negative bevel edge termination formed by counter-doping the base layer according to another embodiment of the present disclosure;

FIG. 12 illustrates an n-type SiC IGBT having a negative bevel edge termination like that illustrated in FIG. 3 according to one embodiment of the present disclosure;

FIG. 13 illustrates an n-type SiC IGBT having a negative bevel edge termination formed by counter-doping the base layer according to another embodiment of the present disclosure;

FIG. 14 illustrates a SiC PIN diode having a negative bevel edge termination like that illustrated in FIG. 3 according to one embodiment of the present disclosure;

FIG. 15 illustrates a SiC PIN diode having a negative bevel edge termination formed by counter-doping one of the semiconductor layers according to another embodiment of the present disclosure;

FIG. 16 illustrates a SiC U-channel Metal-Oxide-Semiconductor Field Effect Transistor (UMOSFET) having a negative bevel edge termination like that illustrated in FIG. 3 according to another embodiment of the present disclosure;

FIG. 17 illustrates a SiC UMOSFET having a negative bevel edge termination formed by counter-doping the base layer according to another embodiment of the present disclosure;

FIG. 18 graphically illustrates carrier distribution within a power thyristor in the on-state;

FIG. 19 graphically illustrates carrier distribution under high-level injection conditions for a P-i-N rectifier;

FIG. 20 graphically illustrates carrier distribution as a function of high-level carrier lifetime under high-level injection conditions for a P-i-N rectifier;

FIGS. 21A through 21D illustrates a process for forming the SiC thyristor of FIG. 2 that includes a number of carrier lifetime enhancement techniques that result in a low on-resistance for the SiC thyristor according to one embodiment of the present disclosure;

FIGS. 22A through 22C graphically illustrate measurements of carrier lifetime for a number of exemplary thyristors formed according to the process of FIGS. 21A through 21D; and FIG. 23 graphically illustrates forward condition characteristics including an on-resistance of a thyristor fabricated using carrier lifetime enhancement techniques according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 2 illustrates a Silicon Carbide (SiC) thyristor 44 having a negative bevel edge termination 46 according to one embodiment of the present disclosure. In this particular embodiment, the thyristor 44 is a Gate Turn-Off (GTO) thyristor. Before proceeding, it should be noted that while the discussion herein focuses on SiC semiconductor devices, the concepts disclosed herein are equally applicable to semiconductor devices fabricated using other types of semiconductor materials (e.g., Silicon). As illustrated, the thyristor 44 includes a substrate 48, an injection layer 50 on a surface of the substrate 48, a field stop layer 52 on a surface of the injection layer 50 opposite the substrate 48, a drift layer 54 on a surface of the field stop layer 52 opposite the injection layer 50, and a base layer 56 on a surface of the drift layer 54 opposite the field stop layer 52. Gate regions 58 and 60 are formed in a surface of the base layer 56 opposite the drift layer 54 and are separated by a desired lateral distance. An anode mesa, or region, 62 is on the surface of the base layer 56 between the gate regions 58 and 60. An anode contact 64 is on a surface of the anode mesa 62 opposite the base layer 56, a cathode contact 66 is on a surface of the substrate 48 opposite the injection layer 50, and gate contacts 68 and 70 are on the surface of the base layer 56 over the gate regions 58 and 60, respectively. Notably, in one exemplary embodiment, the thyristor 44 is fabricated on a semiconductor die having an area greater than or equal to 1 cm$^2$.

The substrate 48 is preferably a SiC substrate, and the injection layer 50, the field stop layer 52, the drift layer 54, the base layer 56, and the anode mesa 62 are preferably all epitaxial layers of SiC grown on the substrate 48. The gate regions 58 and 60 are preferably formed by injecting ions into the base layer 56 via, for example, ion implantation. In this particular embodiment, the substrate 48 is highly doped N-type (N+), the injection layer 50 is highly doped N-type (N+), the field stop layer 52 is highly doped P-type (P+), the drift layer 54 is doped P-type (P), the base layer 56 is doped N-type (N), the gate regions 58 and 60 are highly doped N-type (N+), and the anode mesa 62 is very highly doped P-type (P++). In one embodiment, the substrate 48 has doping level in a range of and including $1\times10^{18}$ to $1\times10^{19}$ cm$^{-3}$ and a thickness in a range of and including about 100 to 350 microns (μm), the injection layer 50 has a doping level greater than or equal to $1\times10^{18}$ cm$^{-3}$ and a thickness in a range of and including 1 to 5 μm, the field stop layer 52 has a doping level in a range of and including $1\times10^{16}$ to $5\times10^{17}$ cm$^{-3}$ and a thickness in a range of and including 1 to 5 μm, the drift layer 54 has a doping level less than $2\times10^{14}$ cm$^{-3}$ and a thickness that is greater than or equal to 80 μm, the base layer 56 has a doping level in a range of and including $1\times10^{16}$ to $1\times10^{18}$ cm$^{-3}$ and a thickness in a range of and including 0.5 to 5 μm, and the anode mesa 62 has a doping level that is greater than $1\times10^{19}$ cm$^{-3}$ and a thickness in a range of and including 0.5 to 5 μm. In one particular embodiment, the substrate 48 has doping level in a range of and including $1\times10^{18}$ to $1\times10^{19}$ cm$^{-3}$ and a thickness in a range of and including about 100 to 350 μm, the injection layer 50 has a doping level of $5\times10^{18}$ cm$^{-3}$ and a thickness of 1 μm, the field stop layer 52 has a doping level of $1\times10^{16}$ cm$^{-3}$ and a thickness of 4 μm, the drift layer 54 has a doping level less than $2\times10^{14}$ cm$^{-3}$ and a thickness of 90 μm, the base layer 56 has a doping level of $1\times10^{17}$ cm$^{-3}$ and a thickness of 2.5 μm, and the anode mesa 62 has a doping level that is greater than $2\times10^{19}$ cm$^{-3}$ and a thickness in a range of and including 0.5 to 5 μm. The gate regions 58 and 60 are N+ regions that, in one embodiment, have a doping level greater than $1\times10^{18}$ cm$^{-3}$. Lastly, the contacts 64, 66, 68, and 70 are formed of any suitable contact material (e.g., metal, metal alloy, etc.).

An edge of the thyristor 44 is terminated by the negative bevel edge termination 46. In one embodiment, a width of the negative bevel edge termination 46 is 600 μm. In the preferred embodiment, a slope angle (α) of the negative bevel edge termination 46 is less than or equal to 15 degrees. As discussed below in more detail, the negative bevel edge termination 46 is implemented as a multi-step negative bevel edge termination that approximates a smooth slope. Notably, a negative bevel having a smooth slope is not obtainable in SiC. For example, wet etching can be used to form a negative bevel edge termination having a smooth slope for Silicon devices, but wet etching is not suitable for SiC and therefore cannot be used to form a negative bevel edge termination having a smooth slope for SiC devices. Therefore, as discussed herein, the negative bevel edge termination 46 is implemented as a multi-step negative bevel edge termination that approximates a smooth slope.

In one embodiment, the multi-step negative bevel edge termination 46 includes a number of steps that approximate a smooth slope at the desired slope angle (α). In one embodiment, the multi-step negative bevel edge termination 46 includes at least 10 steps that approximate a smooth slope at the desired slope angle (α). In another embodiment, the multi-step negative bevel edge termination 46 includes at least 15 steps that approximate a smooth slope at the desired slope angle (α). As a result of the negative bevel edge termination 46, a blocking voltage of the thyristor 44 approaches a blocking voltage of an ideal parallel-plane device. In this particular embodiment, the blocking voltage is greater than or equal to 12 kilovolts (kV). As used herein, the blocking voltage of a device is a voltage at which the device conducts a 1 microamp (μA) current. In the case of the thyristor 44, the blocking voltage is a voltage that, when applied from the anode contact 64 to the cathode contact 66, will cause a 1 μA current to flow through the thyristor 44 when no voltage is applied to the gate contacts 68 and 70.

FIG. 3 illustrates the negative bevel edge termination 46 of FIG. 2 in more detail according to one embodiment of the present disclosure. As shown, the negative bevel edge termination 46 is more specifically a multi-step negative bevel edge termination 46. In this particular embodiment, the multi-step negative bevel edge termination 46 includes 15 steps that approximate the desired slope angle (α). The multi-step negative bevel edge termination 46 relieves field crowding, thereby improving the blocking voltage. As discussed below, in one embodiment, the blocking voltage is improved to at least 12 kV. The multi-step negative bevel edge termination 46 of this embodiment is formed by etching the base layer 56 using a suitable number of masks. In one embodiment, the number of masks is equal to the number of steps (e.g., 15 masks to form 15 steps). In another embodiment, the number of masks may be optimized to reduce the number of etching steps such that the total number of masks is less than the number of steps in the multi-step negative bevel edge termination 46 (e.g., 4-15 masks for 15 steps).

Figure 1:
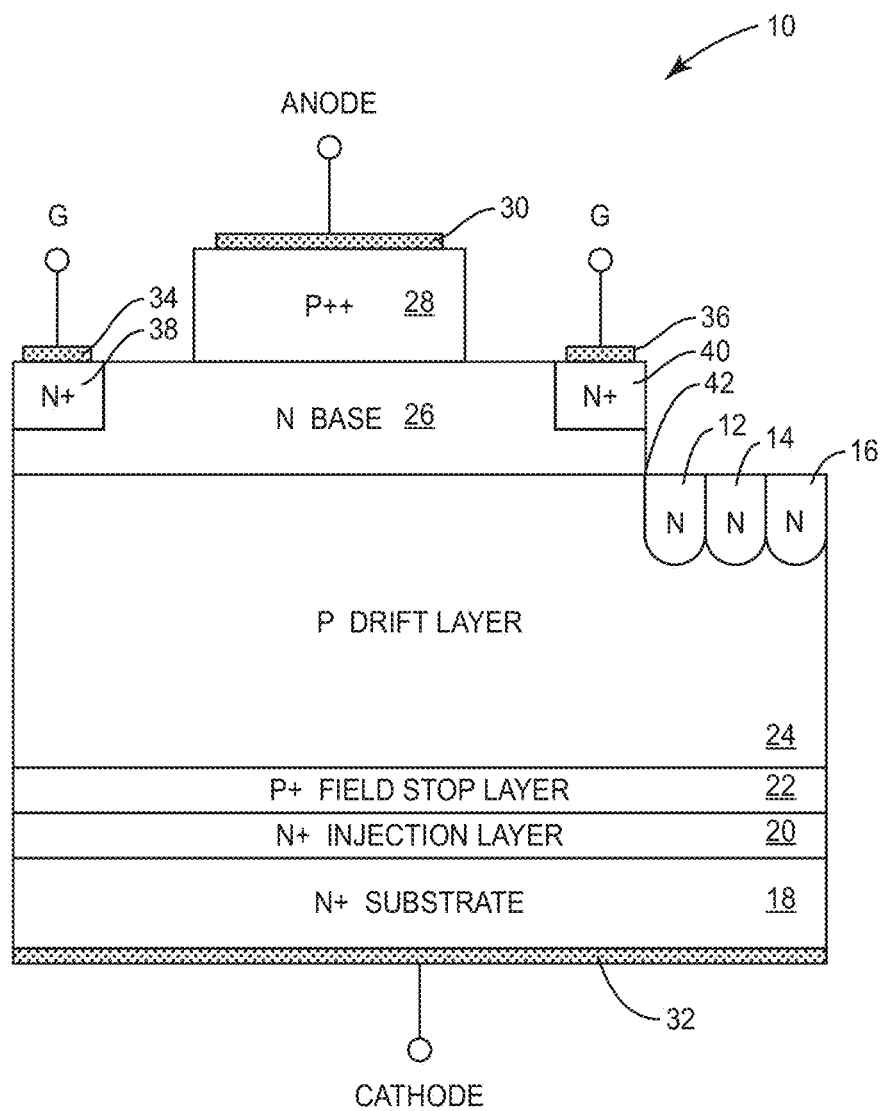
FIG. 1 illustrates a Silicon Carbide (SiC) thyristor including a conventional Junction Termination Extension (JTE) edge termination.

FIG. 4 graphically compares the electric field distribution along the multi-step negative bevel edge termination 46 of FIG. 3 with that of a 15 well Junction Termination Extension (JTE) edge termination at 12 kV according to one embodiment of the present disclosure. As shown, the multi-step negative bevel edge termination 46 has effectively reduced the peak electric field found at the mesa trench corner (e.g., the corner 42 of the thyristor 10 of FIG. 1) to less than 1.4

Mega-Volts per centimeter (MV/cm). In other words, the peak electric field found at the junction edge is reduced by more than 0.2 MV/cm.

FIG. 5 graphically compares the blocking voltage of the thyristor 44 including the multi-step negative bevel edge termination 46 of FIG. 3 with that of a thyristor (e.g., the thyristor 10 of FIG. 1) having a 15 well JTE edge termination according to one embodiment of the present disclosure. As illustrated, as a result of the multi-step negative bevel edge termination 46, the thyristor 44 has a blocking voltage in a range of 11.5 to 12 kV. This is a 3.5 to 4 kV improvement over the 9 kV blocking voltage resulting from the 15 well JTE edge termination.

FIG. 6 illustrates the thyristor 44 including the negative bevel edge termination 46 according to another embodiment of the present disclosure. In this embodiment, rather than etching the base layer 56 to form the multi-step negative bevel edge termination 46 as discussed above with respect to FIG. 3, the negative bevel edge termination 46 is formed by counter-doping the base layer 56 in an edge region 72 adjacent to the gate region 60 opposite the anode mesa 62 with a P-type ion that compensates the n-type conductivity of the base layer 56 in the edge region 72 to provide a neutral, or intrinsic, region 76 having a desired negative bevel characteristic. The P-type ion may be, for example, Aluminum (Al), Boron (B), or the like. The negative bevel edge termination 46 is thereby formed at an interface of the neutral region 76 and a remainder of the base layer 56. More specifically, in one embodiment, ions are implanted to varying depths that increase step-wise starting at the end of the edge region 72 adjacent to the gate region 60 and proceeding outwardly to provide the desired number of steps and slope ($\alpha$) for the negative bevel edge termination 46.

FIG. 7 illustrates another process by which the negative bevel edge termination 46 can be formed. In this embodiment, a sacrificial layer 78 is formed on the surface of the base layer 56 over an area where the negative bevel edge termination 46 is to be formed. The sacrificial layer 78 may be, for example, $SiO_2$, photo-resist, or similar material. The sacrificial layer 78 is etched or otherwise processed to provide a negative bevel 80 having a desired multi-step characteristic (i.e., number of steps, slope angle, width, etc.) for the negative bevel edge termination 46. An etching process is then performed to remove the sacrificial layer 78. More specifically, an etching process is performed to etch to a desired depth (d), which in this example is equal to the thickness of the sacrificial layer 78 and also equal to the thickness of the base layer 56. However, the present disclosure is not limited thereto. As a result of the etching, the negative bevel 80 is effectively transferred to the base layer 56 to thereby provide the multi-step negative bevel edge termination 46.

FIGS. 8 through 17 illustrate additional, non-limiting, examples of other types of SiC devices that can utilize the negative bevel edge termination described above with respect to the thyristor 44. More specifically, FIG. 8 illustrates a SiC Bipolar Junction Transistor (BJT) 82 including a negative bevel edge termination 84 according to one embodiment of the present disclosure. The BJT 82 includes an N+ substrate 86, an N-type drift layer 88 on a surface of the substrate 86, a P-type base layer 90 on a surface of the drift layer 88 opposite the substrate 86, a P+ base region 92 formed in the base layer 90, an N++ emitter mesa 94 on the surface of the base layer 90 opposite the drift layer 88, a base contact 96 on the base region 92, an emitter contact 98 on the emitter mesa 94, and a collector contact 100 on a surface of the substrate 86 opposite the drift layer 88. In this embodiment, the negative bevel edge termination 84 is a multi-step negative bevel edge termination like that of FIG. 3. As a result of the negative bevel edge termination 84, a blocking voltage of the BJT 82 approaches the blocking voltage of the ideal parallel-plane device.

FIG. 9 illustrates the BJT 82 including the negative bevel edge termination 84 according to another embodiment of the present disclosure. In this embodiment, the negative bevel edge termination 84 is formed by counter-doping the P-type base layer 90 in an edge region 102 adjacent to the P+ base region 92 opposite the emitter mesa 94 with an N-type ion that compensates the P-type conductivity of the base layer 90 in the edge region 102 to provide a neutral, or intrinsic, region 106 having a desired negative bevel characteristic. The N-type ion may be, for example, Nitrogen (N), Phosphorous (P), or the like. The negative bevel edge termination 84 is thereby formed at an interface of the neutral region 106 and a remainder of the base layer 90. More specifically, in one embodiment, ions are implanted to varying depths that increase step-wise starting at the end of the edge region 102 adjacent to the P+ base region 92 and proceeding outwardly to provide the desired number of steps and slope ($\alpha$) for the negative bevel edge termination 84.

FIG. 10 illustrates a P-type SiC Insulated Gate Bipolar Transistor (IGBT) 108 including a negative bevel edge termination 110 according to one embodiment of the present disclosure. As illustrated, the IGBT 108 includes a P+ substrate or epilayer 112, an N-type drift layer 114 on a surface of the substrate 112, a base layer 116 on a surface of the drift layer 114 opposite the substrate 112, P+ regions 118 and 120 on the surface of the base layer 116 opposite the drift layer 114, and emitter regions 122 and 124. A gate contact 126 is formed in a trench as shown and is insulated by a gate insulator 128. Emitter contacts 130 and 132 are on the emitter regions 122 and 124, respectively, and a collector contact 134 is on a surface of the substrate 112 opposite the drift layer 114. In this embodiment, the negative bevel edge termination 110 is a multi-step negative bevel edge termination like that of FIG. 3. As a result of the negative bevel edge termination 110, a blocking voltage of the IGBT 108 approaches the blocking voltage of the ideal parallel-plane device.

FIG. 11 illustrates the IGBT 108 including the negative bevel edge termination 110 according to another embodiment of the present disclosure. In this embodiment, the negative bevel edge termination 110 is formed by counter-doping the P-type base layer 116 in an edge region 136 adjacent to the P+ region 118 and the N+ emitter region 122 opposite the gate contact 126 with an N-type ion that compensates the P-type conductivity of the base layer 116 in the edge region 136 to provide a neutral, or intrinsic, region 140 having a desired negative bevel characteristic. The N-type ion may be, for example, Nitrogen (N), Phosphorous (P), or the like. The negative bevel edge termination 110 is thereby formed at an interface of the neutral region 140 and a remainder of the base layer 116. More specifically, in one embodiment, ions are implanted to varying depths that increase step-wise starting at the end of the edge region 136 adjacent to the P+ region 118 and proceeding outwardly to provide the desired number of steps and slope ($\alpha$) for the negative bevel edge termination 110.

FIG. 12 illustrates an n-type SiC IGBT 142 including a negative bevel edge termination 144 according to one embodiment of the present disclosure. As illustrated, the IGBT 142 includes a substrate 146, a drift layer 148 on a surface of the substrate 146, a base layer 150 on a surface of the drift layer 148 opposite the substrate 146, N+ regions 152 and 154 on the surface of the base layer 150 opposite the drift layer 148, and emitter regions 156 and 158. A gate contact 160 is formed in a trench as shown and is insulated by a gate insulator 162. Emitter contacts 164 and 166 are on the emitter regions 156 and 158, respectively, and a collector contact 168 is on a surface of the substrate 146 opposite the drift layer 148. In this embodiment, the negative bevel edge termination 144 is a multi-step negative bevel edge termination like that of FIG. 3. As a result of the negative bevel edge termination 144, a blocking voltage of the IGBT 142 approaches the blocking voltage of the ideal parallel-plane device.

FIG. 13 illustrates the IGBT 142 including the negative bevel edge termination 144 according to another embodiment of the present disclosure. In this embodiment, the negative bevel edge termination 144 is formed by counter-doping the N-type base layer 150 in an edge region 170 adjacent to the N+ region 152 and the P+ emitter region 156 opposite the gate contact 160 with a P-type ion that compensates the N-type conductivity of the base layer 150 in the edge region 170 to provide a neutral, or intrinsic, region 174 having a desired negative bevel characteristic. The P-type ion may be, for example, Aluminum (Al), Boron (B), or the like. The negative bevel edge termination 144 is thereby formed at an interface of the neutral region 174 and a remainder of the base layer 150. More specifically, in one embodiment, ions are implanted to varying depths that increase step-wise starting at the end of the edge region 170 adjacent to the N+ region 152 and the P+ emitter region 156 and proceeding outwardly to provide the desired number of steps and slope ($\alpha$) for the negative bevel edge termination 144.

FIG. 14 illustrates a SiC PIN diode 176 including a negative bevel edge termination 178 according to one embodiment of the present disclosure. As illustrated, the PIN diode 176 includes an N+ substrate 180, a N– drift layer 182, a P-type layer 184, and P++ layer 186 arranged as shown. The N– drift layer 182 may also be referred to herein as an intrinsic layer between the N+ substrate 180 and the P-type layer 184 forming the PIN diode 176. The P++ layer 186 may also be referred to herein as an anode mesa. An anode contact 188 is on the surface of the P++ layer 186 opposite the P-type layer 184. A cathode contact 190 is on a surface of the N+ substrate 180 opposite the N– drift layer 182. In this embodiment, the negative bevel edge termination 178 is a multi-step negative bevel edge termination like that of FIG. 3. As a result of the negative bevel edge termination 178, a blocking voltage, which is more specifically a reverse breakdown voltage of the PIN diode 176, approaches the blocking voltage of the ideal parallel-plane device.

FIG. 15 illustrates the PIN diode 176 including the negative bevel edge termination 178 according to another embodiment of the present disclosure. In this embodiment, the negative bevel edge termination 178 is formed by counter-doping the P-type layer 184 in an edge region 192 adjacent to the P++ layer 186 with an N-type ion that compensates the P-type conductivity of the P-type layer 184 in the edge region 192 to provide a neutral, or intrinsic, region 196 having a desired negative bevel characteristic. The N-type ion may be, for example, Nitrogen (N), Phosphorous (P), or the like. The negative bevel edge termination 178 is thereby formed at an interface of the neutral region 196 and a remainder of the P-type layer 184. More specifically, in one embodiment, ions are implanted to varying depths that increase step-wise starting at the end of the edge region 192 adjacent to the P++ layer 186 and proceeding outwardly to provide the desired number of steps and slope ($\alpha$) for the negative bevel edge termination 178.

FIG. 16 illustrates a SiC U-channel Metal-Oxide-Semiconductor Field Effect Transistor (UMOSFET) 198 including a negative bevel edge termination 200 according to one embodiment of the present disclosure. As illustrated, the UMOSFET 198 includes an N+ substrate 202, an N-type drift layer 204 on a surface of the substrate 202, a P-type base layer 206 on a surface of the drift layer 204 opposite the substrate 202, P+ regions 208 and 210 on the surface of the base layer 206 opposite the drift layer 204, and N+ source regions 212 and 214. A gate contact 216 is formed in a trench as shown and is insulated by a gate insulator 218. Source contacts 220 and 222 are on the source regions 212 and 214, respectively, and a drain contact 224 is on a surface of the substrate 202 opposite the drift layer 204. In this embodiment, the negative bevel edge termination 200 is a multi-step negative bevel edge termination like that of FIG. 3. As a result of the negative bevel edge termination 200, a blocking voltage of the UMOSFET 198 approaches the blocking voltage of the ideal parallel-plane device.

FIG. 17 illustrates the UMOSFET 198 including the negative bevel edge termination 200 according to another embodiment of the present disclosure. In this embodiment, the negative bevel edge termination 200 is formed by counter-doping the P-type base layer 206 in an edge region 226 adjacent to the P+ region 208 and the N+ source region 212 opposite the gate contact 216 with an N-type ion that compensates the P-type conductivity of the base layer 206 in the edge region 226 to provide a neutral, or intrinsic, region 230 having a desired negative bevel characteristic. The N-type ion may be, for example, Nitrogen (N), Phosphorous (P), or the like. The negative bevel edge termination 200 is thereby formed at an interface of the neutral region 230 and a remainder of the base layer 206. More specifically, in one embodiment, ions are implanted to varying depths that increase step-wise starting at the end of the edge region 226 adjacent to the P+ region 208 and the N+ source region 212 and proceeding outwardly to provide the desired number of steps and slope ($\alpha$) for the negative bevel edge termination 200.

Finally, it should be noted that the number of steps in the multi-step negative bevel edge termination 46, 84, 110, 144, 178, and 200 of the various devices described herein may vary depending on the particular implementation. Some exemplary embodiments of the multi-step negative bevel edge termination 46, 84, 110, 144, 178, and 200 include at least 5 steps, at least 7 steps, at least 10 steps, at least 12 steps, at least 15 steps, at least 17 steps, at least 20 steps, a number of steps in a range of and including 5 to 20 steps, a number of steps in a range of and including 10 to 20 steps, a number of steps in a range of and including 15 to 20 steps, and a number of steps in a range of and including 10 to 15 steps. Also, the blocking voltages of the various devices may also vary depending on the particular implementation. Some exemplary embodiments include a blocking voltage of at least 10 kV, a blocking voltage of at least 12 kV, a blocking voltage of at least 15 kV, a blocking voltage of at least 17 kV, a blocking voltage of at least 20 kV, a blocking voltage of at least 22 kV, a blocking voltage of at least 25 kV, a blocking voltage in a range of and including 10 kV to 25 kV, a blocking voltage in a range of and including 12 kV to 25 kV, a blocking voltage in a range of and including 15 kV to 25 kV, a blocking voltage in a range of and including 12 kV to 20 kV, and a blocking voltage in a range of and including 12 kV to 15 kV.

Referring back to FIG. 2, the forward conduction characteristic of the high blocking voltage (e.g., ≥10 kV) thyristor 44, and thus an on-resistance of the thyristor 44, is a function of the carrier lifetime of the drift layer 54. However, due to the high blocking voltage of the thyristor 44, the drift layer 54 is relatively thick (e.g., as much at 160 microns or more for a blocking voltage up to 20 kV) and highly resistive. The carrier lifetime of the drift layer 54 is normally relatively low, which results in a less than optimal on-resistance for the thyristor 44. The following discussion describes a number of carrier lifetime enhancement techniques that can be used to provide a low on-resistance while maintaining the high blocking voltage.

Before discussing the carrier lifetime enhancement techniques, a brief analysis of the forward conduction characteristics of the thyristor 44 may be beneficial. As an example to analyze the forward conduction characteristics, the thyristor 44 can be treated as a P-i-N rectifier. As shown in FIG. 18, the electron and hole concentrations within the N-base and P-base regions of the conventional thyristor (PNPN) take a catenary distribution in accordance with the analysis for the P-i-N rectifier, which is shown in FIG. 19. Because both electrons and holes are available for current transport under high-level injection conditions, total forward current flow, $J_T$, and specific resistance of the drift region, $R_{d,SP}$, can be calculated from average carrier density, $n_a$, in the drift regions by Equations (1) and (2) below:

$$J_T = \frac{2 \cdot q \cdot n_a \cdot d}{\tau_{HL}} (A/cm^2) \qquad (1)$$

$$R_{d,SP} = \frac{2 \cdot d}{q \cdot (\mu_n + \mu_p) \cdot n_a} (\Omega \cdot cm^2), \qquad (2)$$

where $\tau_{HL}$ is high-level carrier lifetime and d is half of the thickness of the drift layer 54. Rearranging Equation (1) and then substituting it into Equation (2) gives the specific resistance of the drift layer 54 in Equation (3):

$$R_{d,SP} = \frac{4 \cdot d^2}{(\mu_n + \mu_p) \cdot J_T \cdot \tau_{HL}} (\Omega \cdot cm^2). \qquad (3)$$

A voltage drop across the drift layer 54, $V_{fM}$, is then given by Equation (4) below:

$$V_{fM} = J_T \cdot R_{d,SP} = \frac{4 \cdot d^2}{(\mu_n + \mu_p) \cdot \tau_{HL}} (V). \qquad (4)$$

It is clearly illustrated in Equations (3) and (4) that both specific resistance and voltage drop of the drift layer 54 reduce with increasing the carrier lifetime, which is also evidenced in FIG. 20 where higher lifetime results in higher carrier density in the drift region. Thus, the conductivity modulation phenomenon at high injection levels enables maintaining a low voltage drop across the drift layer 54, which is beneficial for getting a low on-state voltage drop in bipolar diodes and transistors.

FIGS. 21A through 21D illustrate a process for fabricating the thyristor 44 of FIG. 2 using a number of carrier lifetime enhancement techniques that result in the thyristor 44 having a low on-resistance according to one embodiment of the present disclosure. As shown in FIG. 21A, the process begins with an epitaxial structure including the substrate 48, the injection layer 50, the field stop layer 52, the drift layer 54, the base layer 56, and a layer 62' to be etched to form the anode mesa 62. Next, as shown in FIG. 21B, the layer 62' is etched to form the anode mesa 62. After etching the layer 62' to form the anode mesa 62, an oxidation and subsequent oxide removal process is performed. The oxidation process is preferably a dry-oxidation process where the structure of FIG. 21B is heated at a temperature in a range of and including 1200° C. to 1450° C. for a duration of 1 hour to 15 hours. In one particular embodiment, the dry-oxidation process is performed by heating the structure of FIG. 21B at a temperature of 1300° C. for 5 hours. The oxide on the surface of the structure resulting from the dry-oxidation process is then removed. This dry-oxidation process increases the carrier lifetime, and in particular the minority carrier lifetime, of the drift layer 54.

Next, the negative bevel edge termination 46 is etched or otherwise formed, and the dopants (e.g., N+ dopants) are implanted into the base layer 56 to form the gate regions 58 and 60 as illustrated in FIG. 21C. The implanted dopants are activated by then annealing. This annealing may be performed, for example, at a temperature of 1650° C. for 30 minutes. Note, however, that the annealing temperature and duration may be varied. In particular, the annealing may be at a temperature in a range of and including 1500° C. to 2000° C. for a duration of 1 minute to 60 minutes. However, preferably, the annealing is performed at a temperature in the range of and including 1600° C. to 1800° C. for a duration of 10 to 30 minutes. A sacrificial oxidation process followed by an oxide removal process are then performed to remove damage at the surface of the structure in FIG. 21C resulting from the implantation process. More specifically, in one particular embodiment, the structure of FIG. 21C is heated at a temperature of 1200° C. for 2 hours, rinsed, heated at a temperature of 950° C. for 2 hours, and then rinsed again. Note that the temperature and duration of the heating for this oxidation process may vary. In particular, the sacrificial oxidation is performed at a temperature of 1150° C. to 1450° C. for a duration of 1 hour to 15 hours. However, preferably, the sacrificial oxidation process is performed at a temperature in the range of and including 1200° C. to 1300° C. for a duration of 1 hour to 5 hours. As a result of the annealing process followed by the sacrificial oxidation process, the carrier lifetime of the drift layer 54 is further enhanced. Lastly, the anode, cathode, and gate contacts 64, 66, 68, and 70 are formed, as illustrated in FIG. 21D.

Using the carrier lifetime enhancement techniques in the process of FIGS. 21A through 21D, the thyristor 44 has both a high blocking voltage and a low on-resistance. In one embodiment, the thyristor 44 has a blocking voltage of at least 10 kV and a differential on-resistance of less than 10 m$\Omega \cdot$cm$^2$, more preferably less than 7 m$\Omega \cdot$cm$^2$, and even more preferably of less than 5 m$\Omega \cdot$cm$^2$. In one embodiment, the thyristor 44 has a blocking voltage in a range of and including 10 kV to 15 kV and a differential on-resistance of less than 10 m$\Omega \cdot$cm$^2$, more preferably less than 7 m$\Omega \cdot$cm$^2$, and even more preferably of less than 5 m$\Omega \cdot$cm$^2$. In another embodiment, the thyristor 44 has a blocking voltage of at least 10 kV or in the range of 10 kV to 15 kV and a differential on-resistance in the range of 1 to 10 m$\Omega \cdot$cm$^2$, in the range of 3 to 10 m$\Omega \cdot$cm$^2$, in the range of 1 to 7 m$\Omega \cdot$cm$^2$, in the range of 3 to 7 m$\Omega \cdot$cm$^2$, in the range of 1 to 5 m$\Omega \cdot$cm$^2$, or in the range of 3 to 5 m$\Omega \cdot$cm$^2$. In another embodiment, the thyristor 44 has a blocking voltage of at least 15 kV and a differential on-resistance of less than 15 m$\Omega \cdot$cm$^2$, more preferably less than 10 m$\Omega \cdot$cm$^2$, and even more preferably of less than 7 m$\Omega \cdot$cm$^2$. In another embodiment, the thyristor 44 has a blocking voltage in a range of and including 15 kV to 20 kV and a differential on-resistance of less than 15 m$\Omega \cdot$cm$^2$, more preferably less than 10 m$\Omega \cdot$cm$^2$, and even more preferably of less than 7 m$\Omega \cdot$cm$^2$. In another embodiment, the thyristor 44 has a blocking voltage of at least 15 kV or in the range of 15 kV to 20 kV and a differential on-resistance in the range of 1 to 15 m$\Omega \cdot$cm$^2$, in the range of 3 to 15 m$\Omega \cdot$cm$^2$, in the range of 1 to 10 m$\Omega \cdot$cm$^2$, in the range of 3 to 10 mΩ·cm², in the range of 1 to 7 mΩ·cm², or in the range of 3 to 7 mΩ·cm². In another embodiment, the thyristor 44 has a blocking voltage of at least 20 kV and a differential on-resistance of less than 20 mΩ·cm², more preferably less than 15 mΩ·cm², and even more preferably of less than 10 mΩ·cm². In another embodiment, the thyristor 44 has a blocking voltage in a range of and including 20 kV to 25 kV and a differential on-resistance of less than 20 mΩ·cm², more preferably less than 15 mΩ·cm², and even more preferably of less than 10 mΩ·cm². In another embodiment, the thyristor 44 has a blocking voltage of at least 20 kV or in the range of 20 kV to 25 kV and a differential on-resistance in the range of 1 to 20 mΩ·cm², in the range of 3 to 20 mΩ·cm², in the range of 7 to 20 mΩ·cm², in the range of 1 to 15 mΩ·cm², in the range of 3 to 15 mΩ·cm², in the range of 7 to 20 mΩ·cm², in the range of 1 to 10 mΩ·cm², in the range of 3 to 10 mΩ·cm², or in the range of 7 to 10 mΩ·cm².

Using the carrier lifetime enhancement techniques, the drift layer 54 of the thyristor 44 can be thicker, and thus provide a higher blocking voltage, while maintaining a suitable on-resistance. For example, the drift layer 54 may have a thickness greater than 80 μm, a thickness greater than 100 μm, a thickness greater than 120 μm, a thickness greater than 140 μm, a thickness greater than 160 μm, a thickness in the range of and including 80 μm to 200 μm, a thickness in the range of and including 80 μm to 160 μm, a thickness in the range of and including 100 μm to 200 μm, a thickness in the range of and including 100 μm to 160 μm, a thickness in the range of and including 140 μm to 200 μm, or a thickness in the range of and including 140 μm to 160 μm, or a thickness in the range of and including 160 μm to 200 μm. However, other thicknesses may be used depending on the desired blocking voltage and the particular implementation.

FIGS. 22A through 22C illustrate results of carrier lifetime measurements for a number of exemplary thyristors 44 fabricated according to the process of FIGS. 21A through 21D. Specifically, FIG. 22A illustrates an average carrier lifetime measure, a median carrier lifetime measurement, a minimum carrier lifetime measurement, a maximum carrier lifetime measure, and a deviation of the carrier lifetime measures for a number of structures such as that of FIG. 21A. In this example, the drift layer 54 is a 90 μm thick p-type SiC material layer and has a doping level of less than $2\times10^{14}$ cm⁻³. FIG. 22B illustrates similar carrier lifetime measurements after etching the anode mesa 62 and performing a dry-oxidation process at a temperature of 1300° C. for 5 hours. As shown, after performing the dry-oxidation process, the carrier lifetime is significantly increased. Lastly, FIG. 22C illustrates carrier lifetime measurements after etching the negative bevel edge termination 46, implanting the gate regions 58 and 60, and performing the sacrificial oxidation process. In this particular example, the sacrificial oxidation process included heating at a temperature of 1200° C. for 2 hours, rinsing, heating at a temperature of 950° C. for 2 hours, and then rinsing again. As illustrated, the implant anneal followed by the sacrificial oxidation process further increased the carrier lifetime for the drift layer 54.

FIG. 23 graphically illustrates the on-resistance of one example of the thyristor 44 having a blocking voltage of at least 10 kV that was formed using the carrier lifetime enhancement techniques described above. As illustrated, in this example, the differential on-resistance is less than 5 mΩ·cm² at a current density of 100 A/cm² (i.e., high-level injection condition) due to improved carrier lifetime. Notably, at case temperatures less than 100° C., the differential on-resistance is about 4 mΩ·cm².

While the carrier lifetime enhancement techniques above have been described with respect to the thyristor 44, the carrier lifetime enhancement techniques may be utilized for any semiconductor device, and in particular any type of SiC semiconductor device, that is bipolar (i.e., uses both electrons and holes for conduction). For example, in addition to being used for the thyristor 44 of FIGS. 2 and 6, the carrier lifetime enhancement techniques may be utilized when fabricating the BJT 82 of FIGS. 8 and 9, the IGBTs 108 and 142 of FIGS. 10, 11, 12, and 13, and the PIN diode 176 of FIGS. 14 and 15 to provide similar on-resistance improvements.

In particular, when fabricating the BJT 82, the oxidation process described above as being performed after etching the anode mesa 62 of the thyristor 44 may be performed after etching the emitter mesa 94. Similarly, the implant anneal and sacrificial oxidation process may be performed after etching or otherwise forming the negative bevel edge termination 84 and implanting the base region 92. In this manner, the carrier lifetime of the drift layer 88 is improved, which in turn decreases the on-resistance of the BJT 82.

In a similar manner, when fabricating the IGBT 108, the oxidation process described above as being performed after etching the anode mesa 62 of the thyristor 44 may be performed after etching the gate trench. Similarly, the implant anneal and sacrificial oxidation process may be performed after etching or otherwise forming the negative bevel edge termination 110 and implanting the P+ regions 118 and 120 and the emitter regions 122 and 124. In this manner, the carrier lifetime of the drift layer 114 is improved, which in turn decreases the on-resistance of the IGBT 108. Likewise, the carrier lifetime techniques can be used for the IGBT 142 of FIGS. 12 and 13.

Lastly, when fabricating the PIN diode 176 of FIGS. 14 and 15, the oxidation process described above as being performed after etching the anode mesa 62 of the thyristor 44 may be performed after etching the P-type layer 184 and the P++ layer 186. Similarly, the implant anneal and sacrificial oxidation process may be performed after implanting the P-type layer 184 to form the negative bevel edge termination 178 in the embodiment of FIG. 15. In this manner, the carrier lifetime of the N− drift layer 182 is improved, which in turn decreases the on-resistance of the PIN diode 176.

Those skilled in the art will recognize improvements and modifications to the preferred embodiments of the present disclosure. All such improvements and modifications are considered within the scope of the concepts disclosed herein and the claims that follow.

What is claimed is:

1. A Silicon Carbide (SiC) semiconductor device having a blocking voltage of at least 10 kilovolts (kV) and an on-resistance of less than 10 milli-ohms centimeters squared (mΩ·cm²).

2. The SiC semiconductor device of claim 1 wherein the SiC semiconductor device is a Bipolar Junction Transistor (BJT).

3. The SiC semiconductor device of claim 1, wherein the on-resistance is a differential on-resistance.

4. The SiC semiconductor device of claim 3 wherein the differential on-resistance is less than 5 mΩ·cm².

5. The SiC semiconductor device of claim 3 wherein the blocking voltage is in a range of and including 10 kV and 15 kV.

6. The SiC semiconductor device of claim 5 wherein the differential on-resistance is less than 5 mΩ·cm².

7. The SiC semiconductor device of claim 3 comprising a multi-step negative bevel edge termination that approximates a smooth slope.

8. The SiC semiconductor device of claim 7 wherein the multi-step negative bevel edge termination includes at least five steps.

9. The SiC semiconductor device of claim 7 wherein the multi-step negative bevel edge termination includes at least ten steps.

10. The SiC semiconductor device of claim 7 wherein the multi-step negative bevel edge termination includes at least fifteen steps.

11. The SiC semiconductor device of claim 7 wherein the blocking voltage of the SiC semiconductor device is in a range of and including 10 to 25 kV.

12. The SiC semiconductor device of claim 7 wherein the blocking voltage of the SiC semiconductor device is in a range of and including 12 to 25 kV.

13. The SiC semiconductor device of claim 7 wherein a slope angle of the multi-step negative bevel edge termination is less than or equal to 15 degrees.

14. The SiC semiconductor device of claim 7 wherein the SiC semiconductor device is a thyristor comprising:
a substrate of a first conductivity type;
a drift layer of a second conductivity type on a surface of the substrate;
a base layer of the first conductivity type on a surface of the drift layer opposite the substrate;
an anode mesa of the second conductivity type on a surface of the base layer opposite the drift layer; and
a gate region formed in the surface of the base layer;
wherein the multi-step negative bevel edge termination is formed in the base layer adjacent to the gate region opposite the anode mesa.

15. The SiC semiconductor device of claim 5 wherein the SiC semiconductor device is a PIN diode comprising:
a substrate of a first conductivity type;
a drift layer of the first conductivity type on a surface of the substrate;
a semiconductor layer of a second conductivity type on a surface of the drift layer opposite the substrate;
an anode mesa on a surface of the semiconductor layer of the second conductivity type opposite the drift layer;
an anode contact on a surface of the anode mesa opposite the drift layer; and
a cathode contact on a surface of the substrate opposite the drift layer;
wherein the multi-step negative bevel edge termination is formed in the semiconductor layer of the second conductivity type adjacent to the anode mesa.

16. The SiC semiconductor device of claim 3 wherein the SiC semiconductor device is one of a group consisting of: a thyristor, an Insulated Gate Bipolar Transistor (IGBT), and a PIN diode.

17. The SiC semiconductor device of claim 1 comprising a multi-step negative bevel edge termination that approximates a smooth slope.

18. The SiC semiconductor device of claim 17 wherein the SiC semiconductor device is a Bipolar Junction Transistor (BJT) comprising:
a substrate of a first conductivity type;
a drift layer of the first conductivity type on a surface of the substrate;
a base layer of a second conductivity type on a surface of the drift layer opposite the substrate;
a base region of the second conductivity type formed in a surface of the base layer opposite the drift layer; and
an emitter mesa on the surface of the base layer opposite the drift layer and adjacent to the base region;
wherein the multi-step negative bevel edge termination is formed in the base layer adjacent to the base region opposite the emitter mesa.

19. The SiC semiconductor device of claim 17 wherein the SiC semiconductor device is a Bipolar Junction Transistor (BJT) comprising:
a substrate of a first conductivity type;
a drift layer of a second conductivity type on a surface of the substrate;
a base layer of the first conductivity type on a surface of the drift layer opposite the substrate;
an emitter region of the second conductivity type on a surface of the base layer opposite the drift layer; and
a gate trench formed in a surface of the BJT adjacent to the emitter region and extending into the drift layer;
wherein the multi-step negative bevel edge termination is formed in the base layer adjacent to the emitter region opposite the gate trench.

20. A Silicon Carbide (SiC) semiconductor device having a blocking voltage of at least 15 kilovolts (kV) and an on-resistance of less than 15 milli-ohms centimeters squared ($m\Omega \cdot cm^2$).

21. The SiC semiconductor device of claim 20, wherein the on-resistance is a differential on-resistance.

22. The SiC semiconductor device of claim 21 wherein the differential on-resistance is less than 7 $m\Omega \cdot cm^2$.

23. The SiC semiconductor device of claim 21 wherein the blocking voltage is in a range of and including 15 kV and 20 kV.

24. The SiC semiconductor device of claim 23 wherein the differential on-resistance is less than 7 $m\Omega \cdot cm^2$.

25. The SiC semiconductor device of claim 21 comprising a multi-step negative bevel edge termination that approximates a smooth slope.

26. A Silicon Carbide (SiC) semiconductor device having a blocking voltage of at least 20 kilovolts (kV) and an on-resistance of less than 20 milli-ohms centimeters squared ($m\Omega \cdot cm^2$).

27. The SiC semiconductor device of claim 26, wherein the on-resistance is a differential on-resistance.

28. The SiC semiconductor device of claim 27 wherein the differential on-resistance is less than 10 $m\Omega \cdot cm^2$.

29. The SiC semiconductor device of claim 27 wherein the blocking voltage is in a range of and including 20 kV and 25 kV.

30. The SiC semiconductor device of claim 29 wherein the differential on-resistance is less than 10 $m\Omega \cdot cm^2$.

31. The SiC semiconductor device of claim 27 comprising a multi-step negative bevel edge termination that approximates a smooth slope.

* * * * *